(12) United States Patent
Hazbun et al.

(10) Patent No.: US 11,515,158 B2
(45) Date of Patent: Nov. 29, 2022

(54) SEMICONDUCTOR STRUCTURE WITH SEMICONDUCTOR-ON-INSULATOR REGION AND METHOD

(71) Applicant: GLOBALFOUNDRIES U.S. Inc., Malta, NY (US)

(72) Inventors: Ramsey Hazbun, Colchester, VT (US); Alvin J. Joseph, Williston, VT (US); Siva P. Adusumilli, South Burlington, VT (US); Cameron Luce, Colchester, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 72 days.

(21) Appl. No.: 16/815,070

(22) Filed: Mar. 11, 2020

(65) Prior Publication Data
US 2021/0287902 A1 Sep. 16, 2021

(51) Int. Cl.
*H01L 21/02* (2006.01)

(52) U.S. Cl.
CPC .. *H01L 21/02433* (2013.01); *H01L 21/02381* (2013.01); *H01L 21/02639* (2013.01); *H01L 21/02647* (2013.01)

(58) Field of Classification Search
CPC ......... H01L 2924/0002; H01L 2924/00; H01L 2924/00014; H01L 29/0649; H01L 27/1203
See application file for complete search history.

(56) References Cited

U.S. PATENT DOCUMENTS

| 4,522,662 A | 6/1985 | Bradbury et al. |
| 6,537,894 B2 | 3/2003 | Skotnicki et al. |

(Continued)

FOREIGN PATENT DOCUMENTS

EP 1530800 A2 5/2005

OTHER PUBLICATIONS

Cressler et al., The Silicon Heterostructure Handbook, Taylor & Francis Group, LLC, 2006, pp. 2.11-187-2.11-209.

(Continued)

*Primary Examiner* — Tony Tran
(74) *Attorney, Agent, or Firm* — Yee Tze Lim; Hoffman Warnick LLC

(57) ABSTRACT

Disclosed are semiconductor structure embodiments of a semiconductor-on-insulator region on a bulk substrate. The semiconductor-on-insulator region includes an upper semiconductor layer above and physically separated from the substrate by insulator-containing cavities (e.g., by dielectric layer and/or a pocket of trapped air, of trapped gas, or under vacuum) and, optionally, by a lower semiconductor layer. Disclosed method embodiments include forming openings that extend vertically through the upper semiconductor layer, through a sacrificial semiconductor layer and, optionally, through a lower semiconductor layer to the substrate. Then, a selective isotropic etch process is performed to form cavities, which extend laterally off the sides of the openings into the sacrificial semiconductor layer. Depending upon the embodiments, different process steps are further performed to form plugs in at least the upper portions of the openings and insulators (including dielectric layers and/or a pocket of trapped air, of trapped gas or under vacuum) in the cavities.

7 Claims, 24 Drawing Sheets

(56) References Cited

U.S. PATENT DOCUMENTS

| | | |
|---|---|---|
| 7,015,147 B2 | 3/2006 | Lee et al. |
| 8,324,660 B2 | 12/2012 | Lochtefeld et al. |
| 8,382,894 B2 | 2/2013 | Nakai et al. |
| 10,032,663 B1 | 7/2018 | Sucher et al. |
| 10,615,177 B2* | 4/2020 | Zhang ............... H01L 29/66628 |
| 2002/0089032 A1 | 7/2002 | Huang |
| 2004/0235262 A1 | 11/2004 | Lee et al. |
| 2008/0303090 A1 | 12/2008 | Ieong et al. |
| 2018/0083098 A1* | 3/2018 | Goktepeli ........... H01L 27/1203 |
| 2019/0273132 A1 | 9/2019 | Zierak et al. |

OTHER PUBLICATIONS

Bonnevialle et al., "New Insights on Strained-Si On Insulator Fabrication by Top Recrystallization of Amorphized SiGe on SOI," IEEE, 2015, pp. 177-180.

Loubet et al., "Selective Etching of $Si_{1-x}Ge_x$ Versus Si with Gaseous HCl for the Formation of Advanced CMOS Devices," ScienceDirect, Thin Solid Films, vol. 517, Issue 1, 2008, pp. 93-97.

\* cited by examiner

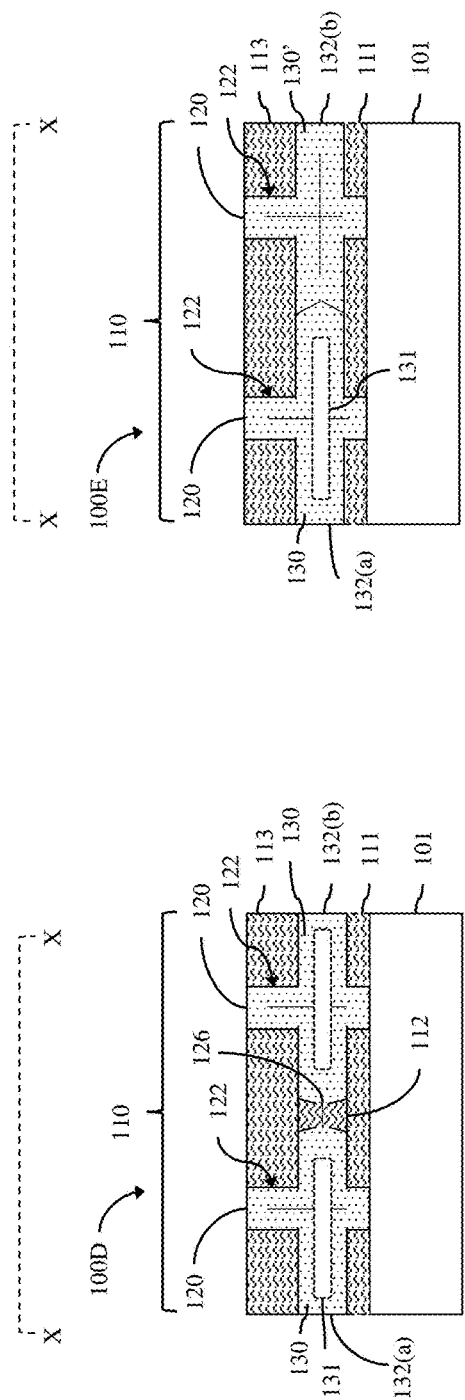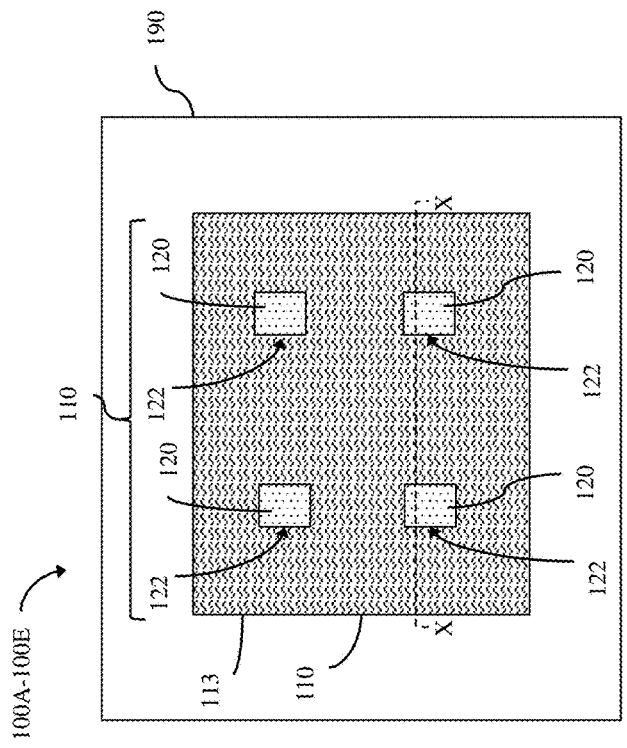

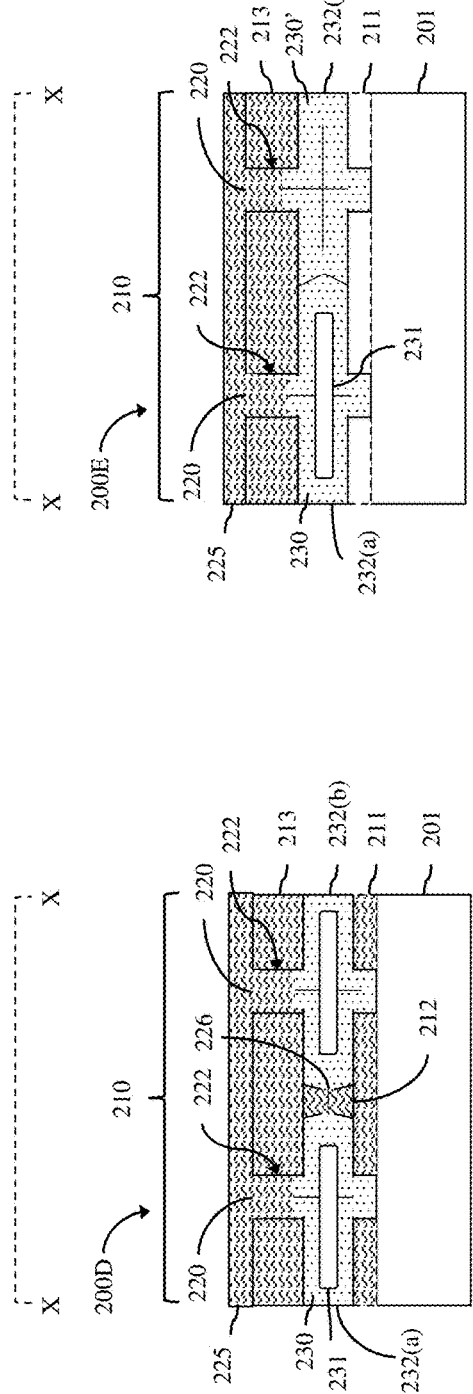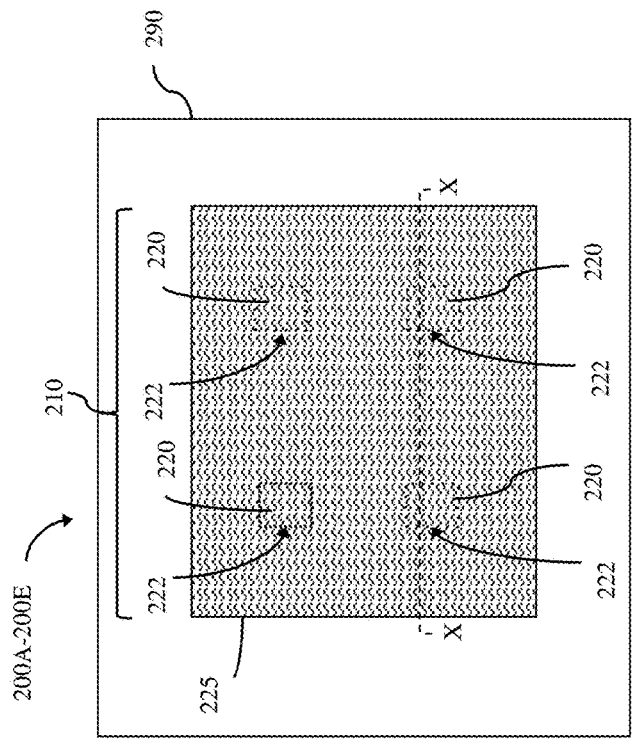

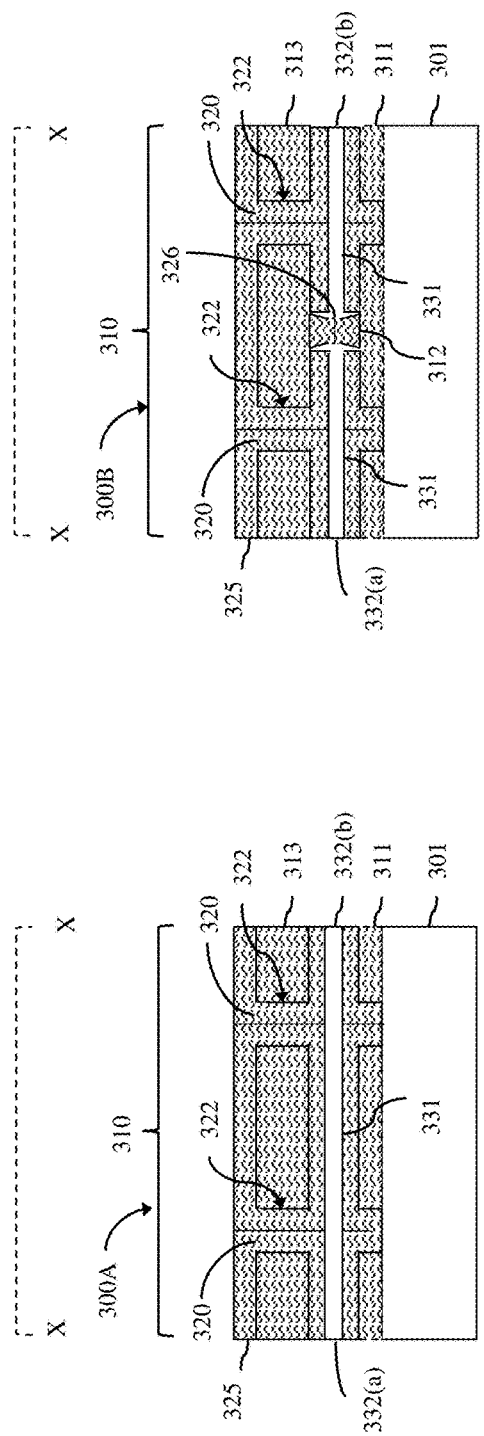
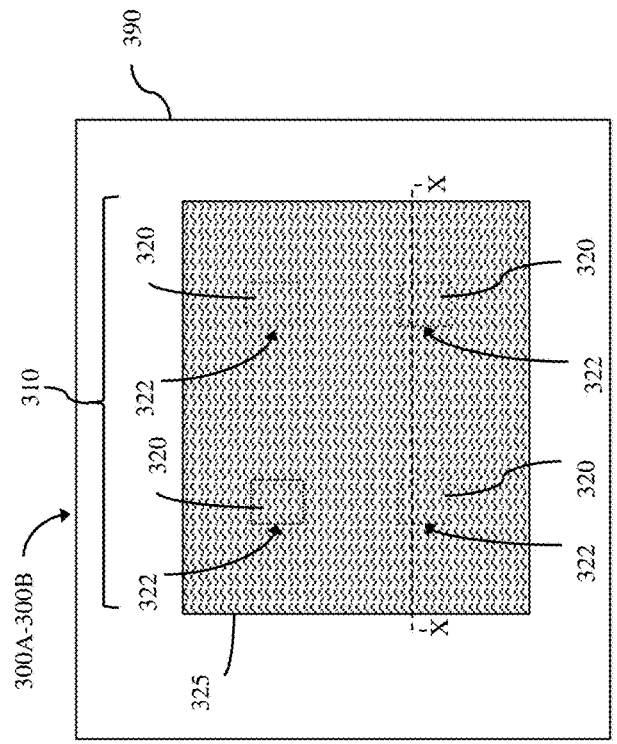
FIG. 3A
FIG. 3B
FIG. 3C

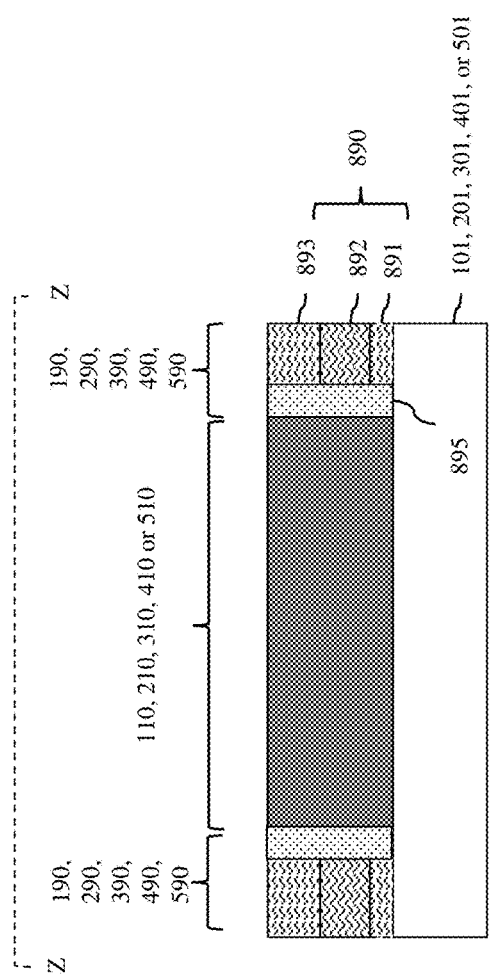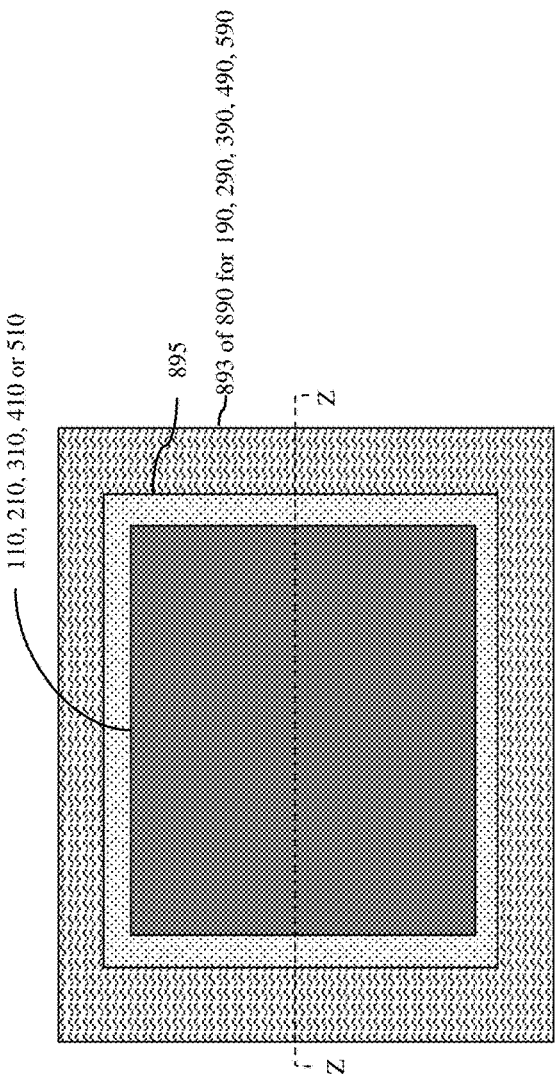

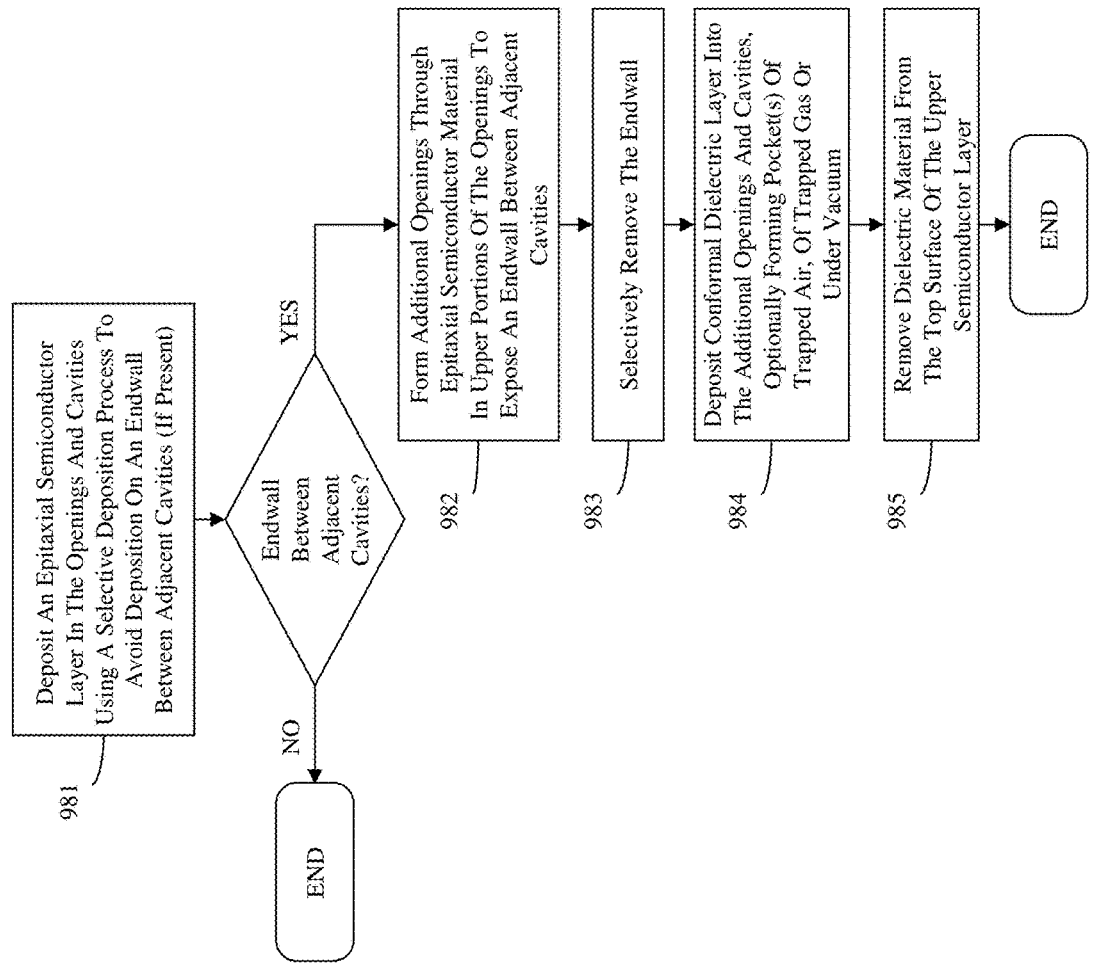

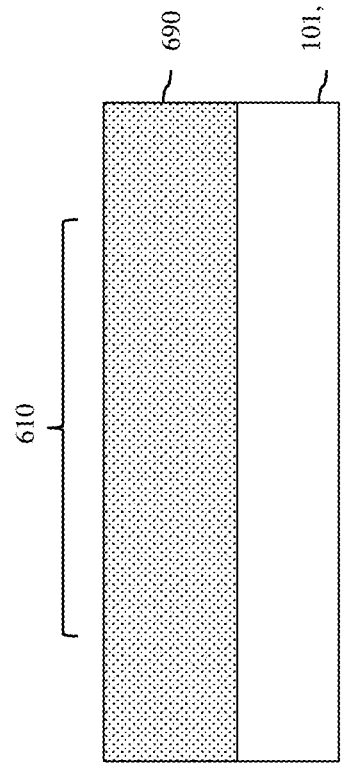

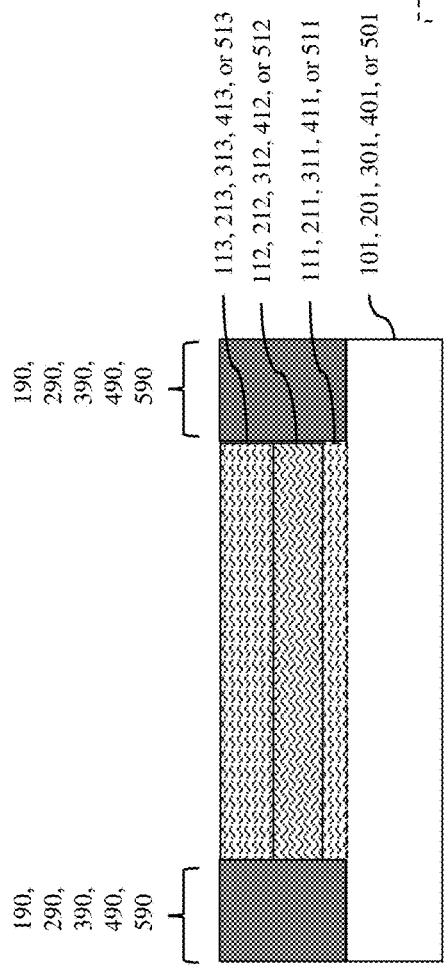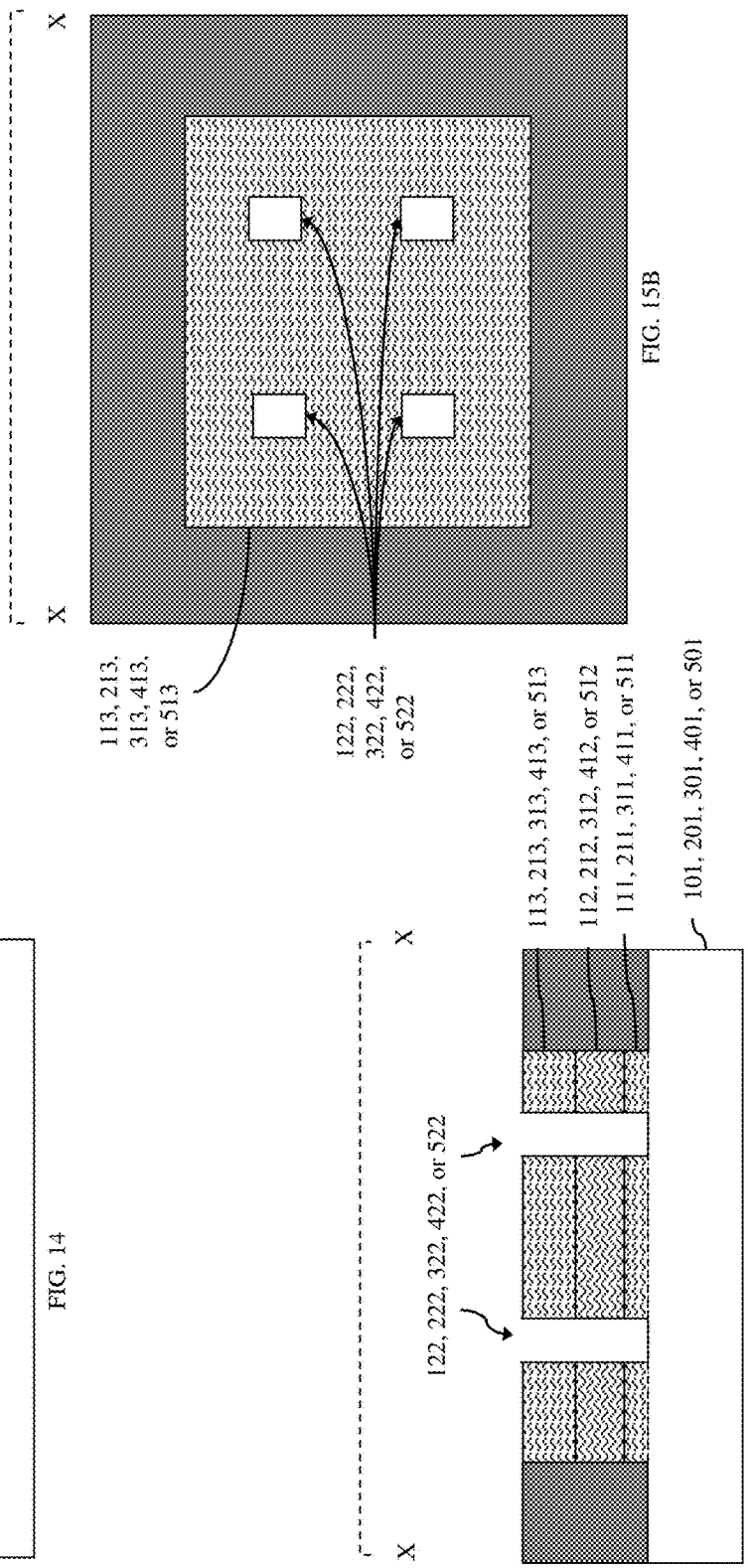

SEMICONDUCTOR STRUCTURE WITH SEMICONDUCTOR-ON-INSULATOR REGION AND METHOD

BACKGROUND

Field of the Invention

The present invention relates to bulk semiconductor substrates and, more particularly, to techniques for providing electrical isolation between a bulk semiconductor substrate and devices formed thereon.

Description of Related Art

Electrical isolation between a semiconductor substrate (e.g., a silicon substrate) and devices formed on the substrate can be achieved through the use of doped well regions. Specifically, p-type or n-type dopants are implanted into regions of the substrate to create p-n junctions at desired locations. Formation of a p-n junction results in an electric field that prevents flow of charge carriers and, thereby prevents the flow of current. However, if the p-n junction is exposed to a voltage level that is beyond a critical breakdown voltage, current will begin to flow across the p-n junction and can result in device failures. One technique for avoiding device failures due to p-n junction breakdowns is to use a semiconductor-on-insulator wafer (e.g., a silicon-on-insulator (SOI) wafer) as opposed to a bulk semiconductor wafer. Specifically, a semiconductor-on-insulator wafer includes a buried insulator layer (e.g., a buried oxide (BOX) layer) sandwiched between a semiconductor layer (e.g., a silicon layer) and a semiconductor substrate (e.g., a silicon substrate). Devices are formed using the semiconductor layer and, thus, are electrically isolated from the semiconductor substrate below by the buried insulator layer. However, formation of semiconductor-on-insulator wafers (e.g., by separation by implantation of oxygen (SIMOX) technique, by bonding together an oxidized silicon wafer and another silicon wafer, etc.) can be cost prohibitive. Furthermore, such enhanced electrical isolation may not be required or even beneficial for all devices formed on the wafer.

SUMMARY

In view of the foregoing, disclosed herein are semiconductor structure embodiments that include a bulk semiconductor substrate and at least one semiconductor-on-insulator region on that bulk semiconductor substrate. The semiconductor-on-insulator region can include an upper semiconductor layer above and physically separated from the semiconductor substrate by insulator-containing cavities (e.g., cavities containing a dielectric layer and/or a pocket of trapped air or gas or under vacuum) and, optionally, by a lower semiconductor layer. Also disclosed herein are embodiments of a method of forming the above-described structure. The method can include forming openings that extend vertically through the upper semiconductor layer, through a sacrificial semiconductor layer and, optionally, through a lower semiconductor layer to the semiconductor substrate. The method can further include performing a selective isotropic etch process to form cavities that extend laterally off the sides of the openings into the sacrificial semiconductor layer and, thus, that are stacked between the substrate and the upper semiconductor layer. Depending upon the embodiments, adjacent cavities can be merged or physically separated. Additionally, depending upon the embodiments, different process steps can further be performed in order to form plugs in at least the upper portions of the openings and to ensure that the cavities contain insulator(s) (e.g., a dielectric layer and/or a pocket of trapped air or gas or under vacuum).

More particularly, disclosed herein are semiconductor structure embodiments that include a bulk semiconductor substrate and at least one semiconductor-on-insulator region above the semiconductor substrate. The semiconductor-on-insulator region can have multiple openings that extend therethrough to the semiconductor substrate. The semiconductor-on-insulator region can further include an upper semiconductor layer above and physically separated from the semiconductor substrate by insulator-containing cavities, which extend laterally from sides of the openings. The semiconductor-on-insulator region can further include plugs that fill at least the upper portions of the openings (i.e., the portions of the openings that extend through the upper semiconductor layer). Optionally, the semiconductor-on-insulator region can further include a lower semiconductor layer stacked between the semiconductor substrate and the insulator-containing cavities.

In some embodiments, each plug can be an insulator plug that fills an opening. The insulator plug can include a dielectric layer and, optionally, a pocket of trapped air or gas or under vacuum encapsulated by the dielectric layer. In other embodiments, each plug can be a semiconductor plug that fills an upper portion of an opening, leaving trapped air or gas in a lower portion of the opening. In still other embodiments, each plug can be a semiconductor-on-insulator plug that includes a semiconductor section that fills an upper portion of the opening and an insulator section (including a dielectric layer and, optionally, a pocket of trapped air or gas or under vacuum) within a lower portion of the opening.

In some embodiments, each insulator-containing cavity can contain a dielectric layer, which completely fills the cavity. In other embodiments, each insulator-containing cavity can contain a pocket of trapped air or gas or under vacuum. In still other embodiments, each insulator-containing cavity can contain a dielectric layer and a pocket of trapped air or gas or under vacuum encapsulated by the dielectric layer.

In some embodiments, adjacent cavities, which extend laterally from the sides of adjacent openings, can be merged into a single relatively large cavity during. In other embodiments, adjacent cavities, which extend laterally from the sides of adjacent openings, can be physically separated by end walls (which are remaining portions of a sacrificial semiconductor layer, which is made of a different semiconductor material than the upper semiconductor layer). To avoid shorting of the upper semiconductor layer to the semiconductor substrate (or, if present, to the lower semiconductor layer) through each end wall, top sections of the end walls are subjected to amorphization and recrystallization during processing. The resulting interface in each end wall between a crystalized bottom section and an amorphized and recrystallized top section can provide the necessary electrical isolation.

Each of the semiconductor structure embodiments disclosed herein can further include a support structure, which is on the semiconductor substrate, which laterally surrounds the semiconductor-on-insulator region and which provides structural support for the upper semiconductor layer above the cavities (particularly during processing following cavity formation). In some embodiments, this support structure can be an isolation region. In other embodiments, the support structure can be a stacked semiconductor region.

Also disclosed herein are embodiments of a method of forming the above-described semiconductor structures with a bulk semiconductor substrate and at least one semiconductor-on-insulator region on the bulk semiconductor substrate.

More particularly, the method embodiments can include providing a bulk semiconductor substrate and forming at least one semiconductor-on-insulator region above the semiconductor substrate. The process of forming the semiconductor-on-insulator region can be performed so that the semiconductor-on-insulator region includes multiple openings that extend therethrough to the semiconductor substrate; an upper semiconductor layer above and physically separated from the semiconductor substrate by insulator-containing cavities, which extend laterally from sides of the openings; and plugs that fill at least the upper portions of the openings (i.e., the portions of the openings that extend through the upper semiconductor layer). Optionally, the process of forming the semiconductor-on-insulator region can be performed so that the semiconductor-on-insulator region further includes a lower semiconductor layer stacked between the semiconductor substrate and the insulator-containing cavities.

More specifically, the process of forming the semiconductor-on-insulator region above the semiconductor substrate can include forming a stack of semiconductor layers on the semiconductor substrate. To form this stack, optionally, a lower semiconductor layer can be epitaxially deposited onto the top surface of the semiconductor substrate; a sacrificial semiconductor layer can be epitaxially deposited onto the semiconductor substrate (or, if present, onto the optional lower semiconductor layer); and an upper semiconductor layer can be epitaxially deposited onto the sacrificial semiconductor layer. It should be noted that the semiconductor material of the sacrificial semiconductor layer can be different from that of the upper semiconductor layer and the semiconductor substrate (or, if present, the optional lower semiconductor layer). Openings can then be formed in the stack in a designated area for the semiconductor-on-insulator region such that these openings extend vertically from a top surface of the upper semiconductor layer through the sacrificial semiconductor layer (through the optional lower semiconductor layer, if present) to the semiconductor substrate. Subsequently, a selective isotropic etch process can be performed. This etch process can specifically be selective to the semiconductor material of the sacrificial semiconductor layer over the different semiconductor material(s) of the upper semiconductor layer and the semiconductor substrate (or, if present, the optional lower semiconductor layer) in order to form cavities, which extend laterally from sides of the openings into the sacrificial semiconductor layer. Thus, the resulting cavities are stacked vertically between the semiconductor substrate (or, if present, the optional lower semiconductor layer) and the upper semiconductor layer.

It should be noted that in some embodiments, the selective isotropic etch process can be performed so that adjacent cavities are merged. In other embodiments, this selective isotropic etch process can be performed so that adjacent cavities remain physically separated by remaining portions of the sacrificial semiconductor layer (referred to as end walls). To avoid shorting of the upper semiconductor layer to the semiconductor substrate (or, if present, the optional lower semiconductor layer) through each end wall, top sections of the end walls can be subjected to amorphization and recrystallization processing. The resulting interface in each end wall between a crystalized bottom section and an amorphized and recrystallized top section can provide the necessary electrical isolation.

As discussed further in the detailed description section, process steps performed prior to formation of the cavities can ensure that a support structure laterally surrounds the designated area for the semiconductor-on-insulator region in order to support the upper semiconductor layer following cavity formation. Also, as discussed further in the detail description section, various additional process steps can be performed following cavity formation to form the plugs in at least the upper portions of the openings and to ensure that the cavities contain insulator(s), thereby completing formation of the plugs and the insulator-containing cavities.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1A-1E are cross-section diagrams of embodiments of a bulk semiconductor structure with semiconductor-on-insulator region(s) thereon and FIG. 1F is a top view diagram of the embodiments shown in FIGS. 1A-1E;

FIGS. 2A-2E are cross-section diagrams of embodiments of a bulk semiconductor structure with semiconductor-on-insulator region(s) thereon and FIG. 2F is a top view diagram of the embodiments shown in FIGS. 2A-2E;

FIGS. 3A-3B are cross-section diagrams of embodiments of a bulk semiconductor structure with semiconductor-on-insulator region(s) thereon and FIG. 3C is a top view diagram of the embodiments of the embodiments shown in FIGS. 3A-3B;

FIGS. 8A-8B are cross-section and top view diagrams of yet another exemplary support structure that can be incorporated into any of the embodiments in FIGS. 1A-5B;

FIGS. 9A-9G show a flow diagram illustrating embodiments of a method of forming the any of the embodiments in FIGS. 1A-5B with any of the support structures shown in FIGS. 6A-8B;

FIG. 10 is a cross-section diagram illustrating a partially completed structure formed at process step 902 of FIG. 9A;

FIGS. 11A-11C are cross-section diagram illustrating partially completed structures formed during process flow A of FIG. 9A;

FIG. 14 is a cross-section diagram illustrating a simplified partially completed structure formed at the completion of process flow A, process flow B or process flow C of FIG. 9A;

FIGS. 15A and 15B are cross-section and top view diagrams illustrating a partially completed structure formed at process step 942 of FIG. 9B;

DETAILED DESCRIPTION

Figure 1A:
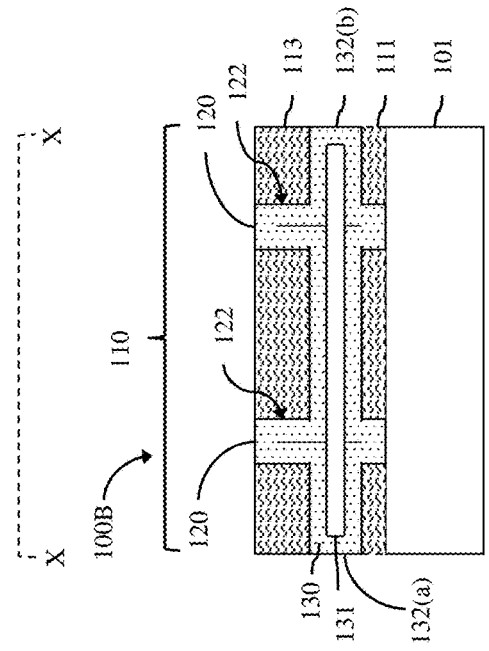

As mentioned above, electrical isolation between a semiconductor substrate (e.g., a silicon substrate) and devices formed on the substrate can be achieved through the use of doped well regions. Specifically, p-type or n-type dopants are implanted into regions of the substrate to create p-n junctions at desired locations. Formation of a p-n junction results in an electric field that prevents flow of charge carriers and, thereby prevents the flow of current. However, if the p-n junction is exposed to a voltage level that is beyond a critical breakdown voltage, current will begin to flow across the p-n junction and can result in device failures. One technique for avoiding device failures due to p-n junction breakdowns is to use a semiconductor-on-insulator wafer (e.g., a silicon-on-insulator (SOI) wafer) as opposed to a bulk semiconductor wafer. Specifically, a semiconductor-on-insulator wafer includes a buried insulator layer (e.g., a buried oxide (BOX) layer) sandwiched between a semiconductor layer (e.g., a silicon layer) and a semiconductor substrate (e.g., a silicon substrate). Devices are formed using the semiconductor layer and, thus, are electrically isolated from the semiconductor substrate below by the buried insulator layer. However, formation of semiconductor-on-insulator wafers (e.g., by separation by implantation of oxygen (SIMOX) technique, by bonding together an oxidized silicon wafer and another silicon wafer, etc.) can be cost prohibitive. Furthermore, such enhanced electrical isolation may not be required or even beneficial for all devices formed on the wafer.

In view of the foregoing, disclosed herein are embodiments of a semiconductor structure that includes a bulk semiconductor substrate and at least one semiconductor-on-insulator region on that bulk semiconductor substrate. The semiconductor-on-insulator region can include an upper semiconductor layer above and physically separated from the semiconductor substrate by insulator-containing cavities (e.g., cavities containing a dielectric layer and/or a pocket of trapped air or gas or under vacuum) and, optionally, by a lower semiconductor layer. Also disclosed herein are embodiments of a method of forming the above-described structure. The method can include forming openings that extend vertically through the upper semiconductor layer, through a sacrificial semiconductor layer and, optionally, through a lower semiconductor layer to the semiconductor substrate. The method can further include performing a selective etch process to form cavities that extend laterally off the sides of the openings into the sacrificial semiconductor layer and, thus, that are stacked between the substrate and the upper semiconductor layer. Depending upon the embodiments, adjacent cavities can be merged or physically separated. Additionally, depending upon the embodiments, different process steps can further be performed in order to form plugs in at least the upper portions of the openings and to ensure that the cavities contain insulator(s) (including a dielectric layer and/or a pocket of trapped air or gas or under vacuum).

Figure 4C:
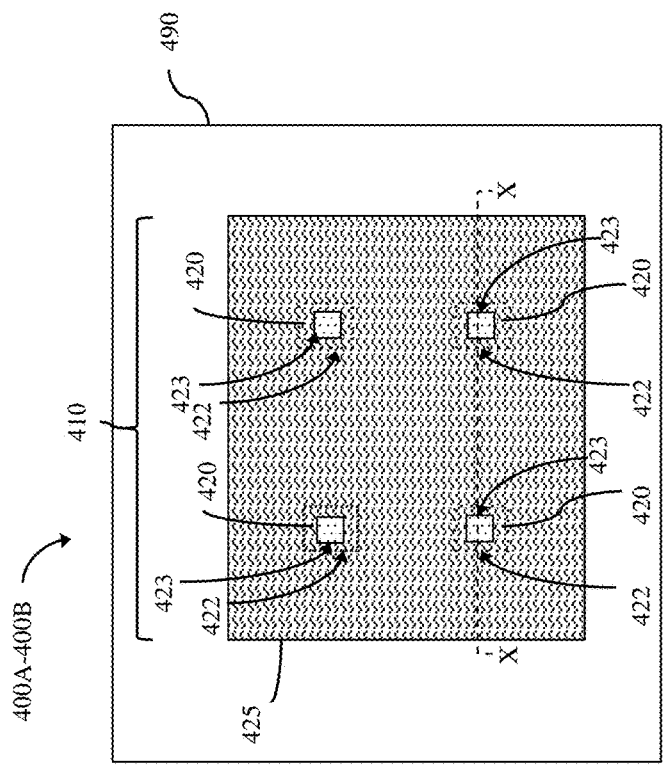
FIGS. 4A-4B are cross-section diagrams of embodiments of a bulk semiconductor structure with semiconductor-on-insulator region(s) thereon and FIG. 4C is a top view diagram of the embodiments shown in FIGS. 4A-4B.
Figure 4A:
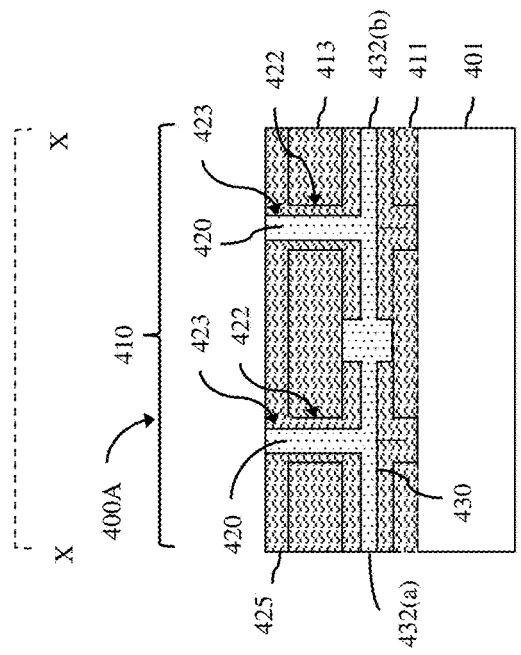
Figure 4B:
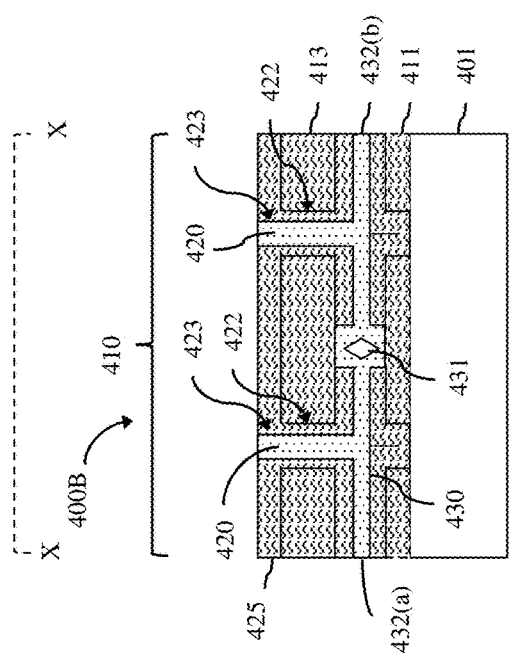
Figure 5C:
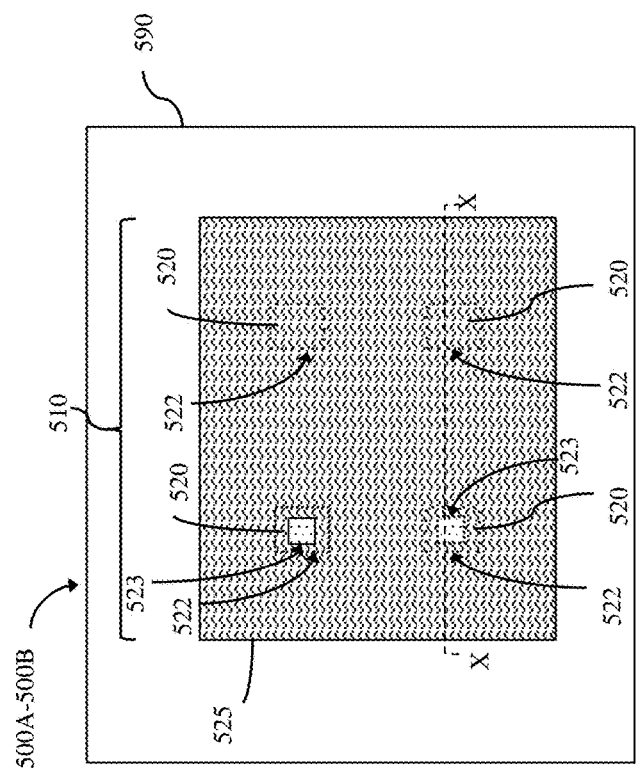
FIGS. 5A-5B are cross-section diagrams of embodiments of a bulk semiconductor structure with semiconductor-on-insulator region(s) thereon and FIG. 5C is a top view diagram of the embodiments shown in FIGS. 5A-5B.
Figure 5A:
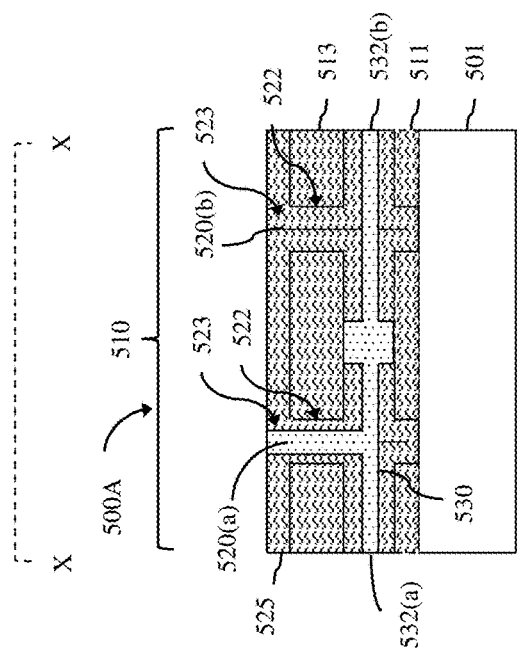
Figure 5B:
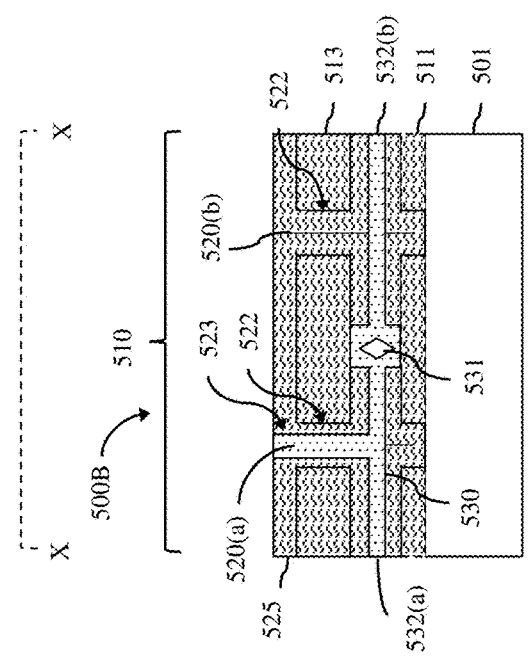

More particularly, disclosed herein are various semiconductor structure embodiments 100A-100E (see the cross-section diagrams of FIGS. 1A-1E, respectively, and the top view diagram of FIG. 1F), 200A-200E (see the cross-section diagrams of FIGS. 2A-2E, respectively, and the top view diagram of FIG. 2F), 300A-300B (see the cross-section diagrams of FIGS. 3A-3B, respectively, and the top view diagram of FIG. 3C), 400A-400B (see the cross-section diagrams of FIGS. 4A-4B, respectively, and the top view diagram of FIG. 4C), and 500A-500B (see the cross-section diagrams of FIGS. 5A-5B, respectively, and the top view diagram of FIG. 5C).

Each of the semiconductor structure embodiments 100A-100E, 200A-200E, 300A-300B, 400A-400B and 500A-500B can include a bulk semiconductor substrate 101, 201, 301, 401, 501. The bulk semiconductor substrate can be a monocrystalline semiconductor material (e.g., monocrystalline silicon).

Each of the semiconductor structure embodiments 100A-100E, 200A-200E, 300A-300B, 400A-400B and 500A-500B can further include at least one semiconductor-on-insulator region 110, 210, 310, 410, 510 (e.g., a silicon-on-insulator (SOI) region or some other type of semiconductor-on-insulator region) above the semiconductor substrate 101, 201, 301, 401, 501 and a support structure 190, 290, 390, 490, 590 above the semiconductor substrate 101, 201, 301, 401, 501 and laterally surrounding the semiconductor-on-insulator-region 110, 210, 310, 410.

The semiconductor-on-insulator region 110, 210, 310, 410, 510 can include an optional lower semiconductor layer 111, 211, 311, 411, 511 above and immediately adjacent to the top surface of the semiconductor substrate 101, 201, 301, 401, 501. This lower semiconductor layer 111, 211, 311, 411, 511 can be an epitaxial monocrystalline semiconductor layer (e.g., an epitaxial monocrystalline silicon layer, an epitaxial monocrystalline silicon germanium layer or some other suitable epitaxial monocrystalline semiconductor layer). The semiconductor-on-insulator region 110, 210, 310, 410, 510 can further include an upper semiconductor layer 113, 213, 313, 413, 513 that is aligned above the semiconductor substrate 101, 201, 301, 401, 501 (or, if applicable, aligned above the optional lower semiconductor layer 111, 211, 311, 411, 511). The upper semiconductor layer 113, 213, 313, 413, 513 can be another epitaxial monocrystalline semiconductor layer (e.g., another epitaxial monocrystalline silicon layer, an epitaxial monocrystalline silicon germanium layer or some other suitable epitaxial monocrystalline semiconductor layer). The upper semiconductor layer 113, 213, 313, 413, 513 can be physically separated and electrically isolated from the semiconductor substrate 101, 201, 301, 401, 501 (or, if applicable, from the optional lower semiconductor layer 111, 211, 311, 411, 511) by insulator-containing cavities 132(*a*)-(*b*), 232(*a*)-(*b*), 332(*a*)-(*b*), 432(*a*)-(*b*), 532(*a*)-(*b*). As discussed in greater detail below, in some embodiments the insulator-containing cavities are merged into a single relatively large cavity and in other embodiments the insulator-containing cavities are physically separated.

More specifically, in the semiconductor-on-insulator region 110, 210, 310, 410, 510, multiple openings 122, 222, 322, 422, 522 can extend vertically from the top surface of the upper semiconductor layer 113, 213, 313, 413, 513 down to the semiconductor substrate 101, 201, 301, 401, 501. Multiple cavities 132(*a*)-(*b*), 232(*a*)-(*b*), 332(*a*)-(*b*), 432(*a*)-

(b), 532(a)-(b) can extend laterally from sides of the openings 122, 222, 322, 422, 522 directly below the upper semiconductor layer 113, 213, 313, 413, 513. Thus, for example, if there is no optional lower semiconductor layer present in the semiconductor-on-insulator region, the cavities 132(a)-(b), 232(a)-(b), 332(a)-(b), 432(a)-(b), 532(a)-(b) extend out laterally from the sides of the lower portions of the openings 122, 222, 322, 422, 522 so that they are sandwiched between the semiconductor substrate 101, 201, 301, 401, 501 and the upper semiconductor layer 113, 213, 313, 413, 513. Alternatively, if the optional lower semiconductor layer 111, 211, 311, 411, 511 is present in the semiconductor-on-insulator region 110, 210, 310, 410, 510 (as shown), then the cavities 132(a)-(b), 232(a)-(b), 332(a)-(b), 432(a)-(b), 532(a)-(b) extend out laterally from the sides of middle portions of the openings so that they are sandwiched between the lower semiconductor layer 111, 211, 311, 411, 511 and the upper semiconductor layer 113, 213, 313, 413, 513.

As discussed in greater detail below with regard to the method embodiments, semiconductor-on-insulator region 110, 210, 310, 410, 510 can be formed by forming a stack of semiconductor layers (which includes) a sacrificial semiconductor layer immediately below the upper semiconductor layer), by forming the openings that extend vertically through the upper semiconductor layer down to the semiconductor substrate (thereby exposing vertical surfaces of the sacrificial semiconductor layer within the openings), by performing a selective etch process to laterally etch the exposed vertical surface of the sacrificial semiconductor layer in each of the openings (thereby creating the cavities) and performing additional processing to form plugs at least in the upper portions of the openings and to ensure that the cavities contain one or more insulator materials. The sacrificial semiconductor layer can be an epitaxial monocrystalline semiconductor layer and the semiconductor material of the sacrificial semiconductor layer can be different from that of the upper semiconductor layer and the semiconductor substrate (or, if present, the optional lower semiconductor layer). For example, if the semiconductor substrate (or, if present, the optional lower semiconductor layer) and the upper semiconductor layer are made of silicon, then the sacrificial semiconductor layer can be made of silicon germanium or vice versa. Alternatively, the stack of semiconductor layers could all be silicon germanium, but the sacrificial semiconductor layer could have a sufficiently different germanium concentration to allow the cavities to be selectively etched. Alternatively, the sacrificial semiconductor layer can be sufficiently different from the upper semiconductor layer and the semiconductor substrate (or, if present, the optional lower semiconductor layer) in some other way that allows the cavities to be selectively etched.

In any case, it should be understood that, while only two cavities (a)-(b) are shown in each cross-section drawing and specifically mentioned in the discussion below, each embodiment will include the same number of cavities as openings. This number could be more than two (e.g., four, five, six, etc.). Furthermore, in some method embodiments, the selective etch process employed during cavity formation can be performed so that adjacent cavities (i.e., cavities that are etched laterally from the sides of adjacent openings) are merged into what is essentially a single relatively large cavity (e.g., see the cavities 132(a)-(b) in the semiconductor structure embodiments 100A-100C of FIGS. 1A-1C, cavities 232(a)-(b) in the semiconductor structure embodiments 200A-200C of FIGS. 2A-2C, and cavities 332(a)-(b) in the semiconductor structure embodiment 300A of FIG. 3A). In other method embodiments, this etch process can be performed so that the adjacent cavities are physically separated by an end wall (i.e., a remaining portion of the sacrificial semiconductor layer, also referred to herein as a pedestal). This end wall or pedestal can remain intact in the final semiconductor structure (e.g., see the end wall between cavities 132(a) and 132(b) in the semiconductor structure embodiment 100D of FIG. 1D, end wall between cavities 232(a) and 232(b) in the semiconductor structure embodiment 200D of FIG. 2D, and the end wall between cavities 332(a) and 332(b) of the semiconductor structure embodiment 300B of FIG. 3B, as discussed in greater detail below). Alternatively, this end wall or pedestal can be selectively removed during subsequent processing (e.g., see the cavities 132(a) and 132(b) in the semiconductor structure embodiment 100E of FIG. 1E, the cavities 232(a) and 232(b) in the semiconductor structure embodiment 200E of FIG. 2E, the cavities 432(a) and 432(b) of the semiconductor structure embodiments 400A and 400B of FIGS. 4A and 4B, and the cavities 532(a) and 532(b) in the semiconductor structure embodiments 500A and 500B of FIGS. 5A and 5B).

As mentioned above, the cavities 132(a)-(b), 232(a)-(b), 332(a)-(b), 432(a)-(b), 532(a)-(b), which are either merged or physically separated by an end wall of the sacrificial semiconductor material, will be insulator-containing cavities in the final semiconductor structure That is, the cavities 132(a)-(b), 232(a)-(b), 332(a)-(b), 432(a)-(b), 532(a)-(b) contain one or more insulator materials. The insulator material and the structural configuration thereof within the cavities vary from embodiment to embodiment (as discussed in greater detail below). In any case, the semiconductor-on-insulator region 110, 210, 310, 410, 510 can further include plugs 120, 220, 320, 420, 520 that fill at least the upper portions of the openings 122, 222, 322, 422, 522 (i.e., the portions of the openings 122, 222, 322, 422, 522 that extend through the upper semiconductor layer 113, 213, 313, 413, 513). The plug material and the structural configuration thereof within the openings also vary from embodiment to embodiment (as discussed in greater detail below).

For example, referring to FIGS. 1A-1F, in some of the semiconductor structure embodiments 100A-100E, the plugs 120 in the openings 122 can be insulator plugs that completely fill the openings 122. In these embodiments, the insulator material(s) of the plugs 120 and contained in the cavities 132(a)-(b) can be a conformal dielectric layer 130 (e.g., a conformal silicon dioxide layer or some other suitable conformal dielectric layer) and, optionally, a pocket 131 (i.e., an area or region or space) of trapped air, of trapped gas or under vacuum that is encapsulated within the conformal dielectric layer 130. For purposes of this disclosure, a pocket under vacuum is an area or region or space that is devoid of matter.

Specifically, in the semiconductor structure embodiments 100A-100C, adjacent cavities 132(a)-(b) that extend laterally from the sides of adjacent openings 122 are merged during processing into a single relatively large cavity. A conformal dielectric layer 130 lines the cavities 132(a)-(b) (which in this case are merged into a single relatively large cavity) and also the adjacent openings 122. Depending upon the size of the openings, the size of the cavities (due to the thickness of the sacrificial semiconductor layer), and the thickness of the conformal dielectric layer 130, etc., the conformal dielectric layer 130 may or may not contained pockets of trapped air in the openings 122 and/or in the cavities 132(a)-(b). For example, the conformal dielectric layer 130 may be completely devoid of any pockets of trapped air, of trapped gas or under vacuum (see the semiconductor structure embodiment 100A in FIG. 1A). Alternatively, during processing the conformal dielectric layer 130 may pinch off in the upper portions of the openings 122 before the cavities 132(a)-(b) and openings 122 are filled such that the conformal dielectric layer 130 contains a pocket 131 of trapped air, of trapped gas or under vacuum that extends laterally almost the full width of the semiconductor-on-insulator region 110 (see the semiconductor structure embodiment 100B of FIG. 1B). Alternatively, during processing the conformal dielectric layer 130 may pinch off in the upper portions of the openings 122 after the cavities 132(a)-(b) are filled but before the openings 122 are filled such that the conformal dielectric layer 130 contains pockets 131 of trapped air, trapped gas or under vacuum in the openings 122 (i.e., in the plugs) (see the semiconductor structure embodiment 100C of FIG. 1C). Alternatively, during processing the conformal dielectric layer 130 may pinch off at one or more other locations with the openings 122 and/or cavities 132(a)-(b) (e.g., at the entrance to the cavities 132(a)-(b), etc.) leaving multiple pockets of trapped air, of trapped gas or under vacuum encapsulated by the conformal dielectric layer 130 in the cavities 132(a)-(b) and/or the openings 122 (not shown).

In the semiconductor structure embodiment 100D, adjacent cavities (e.g., 132(a) and 132(b)) are physically separated by end walls, which are remaining portions of the sacrificial semiconductor layer 112 within which the cavities are formed. In other words, the adjacent cavities are not merged. As mentioned above, the semiconductor material of the sacrificial semiconductor layer 112 is different from that of the upper semiconductor layer and the semiconductor substrate (or, if present, the optional lower semiconductor layer). To avoid shorting of the upper semiconductor layer 113 to the semiconductor substrate 101 (or, if present, to the optional lower semiconductor layer 111) through the end wall, the end wall can have a crystallized bottom section and an amorphized and recrystallized top section so that an interface between the two sections provides the necessary electrical isolation. Additionally, in the semiconductor structure embodiment 100D of FIG. 1D, discrete conformal dielectric layers 130 line each opening 122 and each cavity 132(a)-132(b) such that the end wall is positioned laterally between and immediately adjacent to these conformal dielectric layers 130. It should be understood that, depending upon the size of the openings, the size of the cavities (due to the thickness of the sacrificial semiconductor layer), and the thickness of conformal dielectric layers 130, etc., pockets 131 of trapped air, trapped gas, or under vacuum may optionally be encapsulated within the conformal dielectric layers 130.

Optionally, to avoid relying on the interface between a crystallized bottom section and an amorphized and recrystallized top section of an end wall to provide the necessary electrical isolation between the upper semiconductor layer and the semiconductor substrate (or, if present, the optional lower semiconductor layer), additional processing can be performed during processing in order to selectively remove the end wall. In the semiconductor structure embodiment 100E shown in FIG. 1E, the conformal dielectric layer 130 has been selectively removed from one cavity (e.g., cavity 132(b)), the end wall has been selectively removed, and another conformal dielectric layer 130' has been deposited back into the cavity 132(b) such that the conformal dielectric layer 130' in the cavity 132(b) abuts the conformal dielectric layer 130 in cavity 132(a). Depending upon the size of the openings, the size of the cavities (due to the thickness of the sacrificial semiconductor layer), and the thicknesses of the conformal dielectric layers 130 and 130', etc., pockets 131 may optionally be encapsulated by none, one or both of the conformal dielectric layers 130 and 130'. Furthermore, the dielectric material of the conformal dielectric layers 130 and 130' may be different. For example, the conformal dielectric layer 130 could be silicon dioxide and the conformal dielectric layer 130' could be silicon nitride, silicon oxynitride, etc.

The semiconductor structure embodiments 200A-200E are similar to the semiconductor structure embodiments 100A-100E, respectively, except that the plugs 220 in the openings 222 are semiconductor-on-insulator plugs as opposed to just insulator plugs. In these embodiments, each plug 220 has a semiconductor section that fills an upper portion of an opening 222 and an insulator section that fills a lower portion of the opening 222 below the upper portion.

Specifically, in the semiconductor structure embodiments 200A-200C adjacent cavities 232(a)-(b) that extend laterally from the sides of adjacent openings 222 are merged during processing into a single relatively large cavity. A conformal dielectric layer 230 lines the cavities 232(a)-(b) (which in this case are merged into a single relatively large cavity) and also lower portions of adjacent openings 222. Depending upon the size of the openings, the size of the cavities (due to the thickness of the sacrificial semiconductor layer), and the thickness of the conformal dielectric layer 230, etc., the conformal dielectric layer 230 may or may not contain pockets 231 (i.e., areas, regions, or spaces) of trapped air, trapped gas or under vacuum in the openings 222 and/or in the cavities 232(a)-(b). For example, the conformal dielectric layer 230 may be completely devoid of such pockets (see the semiconductor structure embodiment 200A in FIG. 2A). Alternatively, during processing the conformal dielectric layer 230 may pinch off before the cavities 232(a)-(b) and openings 222 are filled such that the conformal dielectric layer 230 encapsulates a pocket 231 of trapped air, trapped gas or under vacuum that extends laterally almost the full width of the semiconductor-on-insulator region 210 (see the semiconductor structure embodiment 200B of FIG. 2B). As mentioned above, a pocket under vacuum is an area or region or space that is devoid of matter. Alternatively, during processing the conformal dielectric layer 230 may pinch off after the cavities 232(a)-(b) are filled but before the openings 222 are filled such that the conformal dielectric layer 230 encapsulates pockets 231 of trapped air, trapped gas or under vacuum in lower portions openings 222 (i.e., in lower sections of the plugs) (see the semiconductor structure embodiment 100C of FIG. 1C). Alternatively, during processing the conformal dielectric layer 130 may pinch off at one or more other locations with the lower portions of the openings 222 and/or cavities 232(a)-(b) (e.g., at the entrance to the cavities 232(a)-(b), etc.) leaving multiple such pockets encapsulated by the conformal dielectric layer 230 in the cavities 232(a)-(b) and/or the lower portions of the openings 222 (not shown).

In the semiconductor structure embodiment 200D, adjacent cavities (e.g., see cavities 232(a) and 232(b)) are physically separated end walls, which are remaining portions of the sacrificial semiconductor layer within which the cavities are formed. In other words, the adjacent cavities are not merged. As mentioned above, the semiconductor material of the sacrificial semiconductor layer 212 is different from that of the upper semiconductor layer and the semiconductor substrate (or, if present, the optional lower semiconductor layer). To avoid shorting of the upper semiconductor layer 213 to the semiconductor substrate 201 (or, if present, to the optional lower semiconductor layer 211) through the end wall, the end wall can have a crystallized bottom section and an amorphized and recrystallized top section so that an interface between the two sections provides the necessary electrical isolation. Additionally, in the semiconductor structure embodiment 200D of FIG. 2D, discrete conformal dielectric layers 230 line each opening 222 and each cavity 232(a)-232(b) such that the end wall is positioned laterally between and immediately adjacent to these conformal dielectric layers 230. It should be understood that, depending upon the size of the openings, the size of the cavities (due to the thickness of the sacrificial semiconductor layer), and the thickness of conformal dielectric layers 230, etc., pockets 231 of trapped air, of trapped gas or under vacuum may optionally be encapsulated within the conformal dielectric layers 230.

Optionally, to avoid relying on the interface between a crystallized bottom section and an amorphized and recrystallized top section of an end wall to provide the necessary electrical isolation between the upper semiconductor layer and the semiconductor substrate (or, if present, the optional lower semiconductor layer), additional processing can be performed during processing in order to selectively remove the end wall. In the semiconductor structure embodiment 200E shown in FIG. 2E, the conformal dielectric layer has been selectively removed from one cavity (e.g., cavity 232(b)), the end wall has been selectively removed, and another conformal dielectric layer 230' has been deposited back into the adjacent cavity 232(b) such that the conformal dielectric layer 230' in the cavity 232(b) abuts the conformal dielectric layer 230 in the cavity 232(a). Depending upon the size of the openings, the size of the cavities (due to the thickness of the sacrificial semiconductor layer), and the thicknesses of the conformal dielectric layers 230 and 230', etc., pockets 231 of trapped air, trapped gas or under vacuum may optionally be encapsulated by none, one or both of the conformal dielectric layers 230 and 230'. Furthermore, the dielectric material of the conformal dielectric layers 230 and 230' may be different. For example, the conformal dielectric layer 230 could be silicon dioxide and the conformal dielectric layer 230' could be silicon nitride, silicon oxynitride, etc.

In any case, during manufacturing of the semiconductor structure embodiments 200A-200E all dielectric material has been selectively removed from the upper portions of the openings 222 (i.e., from the portions of the openings that extend vertically through the upper semiconductor layer 213) and an epitaxial semiconductor layer 225 (e.g., an epitaxial silicon layer) is formed immediately adjacent to the top surface of the upper semiconductor layer 213 and further on the vertical surfaces of the upper semiconductor layer 213 within the upper portions of the openings 222. The epitaxial semiconductor layer 225 can fill the upper portions of the openings 222 above the remaining conformal dielectric material below such that the plugs 220 in each of the semiconductor structure embodiments 200A-200E are semiconductor-on-insulator plugs. Each semiconductor-on-insulator plug includes an semiconductor section that that includes epitaxial semiconductor material within the upper portion of an opening 222 and an insulator section, which is below the semiconductor section and which includes a conformal dielectric layer and, optionally, pockets 231 of trapped air, of trapped gas or under vacuum encapsulated by that conformal dielectric layer.

In the semiconductor structure embodiments 300A-300B, the plugs 320 that fill the upper portions of the openings 322 are semiconductor plugs and the insulator material contained in the insulator-containing cavities 332(a)-332(b) is trapped air, trapped gas or an area under vacuum.

Specifically, in the semiconductor structure embodiment 300A, adjacent cavities 232(a)-(b), which extend laterally from the sides of adjacent openings 222, are merged during processing into a single relatively large cavity. An epitaxial semiconductor layer 325 (e.g., an epitaxial silicon layer) is immediately adjacent to semiconductor surfaces within the openings 322 and cavities 332(a)-332(b). That is, the epitaxial semiconductor layer 325 can be on the top surface of the upper semiconductor layer. The epitaxial semiconductor layer 325 can further be within the openings 322 on vertical surfaces of the upper semiconductor layer 313 (and, if present, vertical surfaces of the optional lower semiconductor layer 311) and on the top surface of the semiconductor substrate 301. The epitaxial semiconductor layer 325 can further be within the cavities 332(a)-(b) (which as mentioned above are merged into a single relatively large cavity) on the bottom surface of the upper semiconductor layer 313 and on the top surface of the semiconductor substrate 301 (or on the top surface of the optional lower semiconductor layer 311, if present). It should be noted that the width of the openings 322 is less than the height of the cavities 332(a)-(b) (i.e., the thickness of the sacrificial semiconductor layer) so that epitaxial semiconductor material pinches off in the upper portions of the openings 322 to form the plugs 320 (i.e., semiconductor plugs, e.g., silicon plugs) and so that a pocket 331 of trapped air, of trapped gas or under vacuum is within the lower portions of the openings and further within the cavities 332(a)-(b), thereby providing the insulator material for the insulator-containing cavities.

In the semiconductor structure embodiment 300B, adjacent cavities (e.g., see adjacent cavities 332(a) and 332(b)) are physically separated by end walls, which are remaining portions of the sacrificial semiconductor layer within which the cavities are formed. In other words, the adjacent cavities are not merged. As mentioned above, the semiconductor material of the sacrificial semiconductor layer 312 can be different from that of the upper semiconductor layer and the semiconductor substrate (or, if present, the optional lower semiconductor layer). For example, the semiconductor substrate 301, the optional lower semiconductor layer 311 (if present) and upper semiconductor layer 313 can all be silicon and the sacrificial semiconductor layer 312 can be silicon germanium. An epitaxial semiconductor layer 325 (e.g., an epitaxial silicon layer) can be immediately adjacent to silicon surfaces only. That is, the epitaxial semiconductor layer 325 can be on the top surface of the upper semiconductor layer 313. The epitaxial semiconductor layer 325 can be within the openings 322 on vertical surfaces of the upper semiconductor layer 313 (and, if present, the optional lower semiconductor layer 311) and on the top surface of the semiconductor substrate 301. The epitaxial semiconductor layer 325 can further be within the cavities 332(a)-(b) (which as mentioned above are physically separated by an end wall of the sacrificial semiconductor layer 312) on the bottom surface of the upper semiconductor layer 313 and on the top surface of the semiconductor substrate 301 (or on the top surface of the optional lower semiconductor layer 311, if present) but not on the end wall of the sacrificial semiconductor layer 312. To avoid shorting of the upper semiconductor layer 313 to the semiconductor substrate 301 (or, if present, to the optional lower semiconductor layer 311) through the end wall, the end wall can have a crystallized bottom section and an amorphized and recrystallized top section so that an interface between the two sections provides the necessary electrical isolation. Again, it should be noted that the width of the openings 322 is less than the height of the cavities 332(a)-(b) (i.e., the thickness of the sacrificial semiconductor layer) so that epitaxial semiconductor material pinches off in the upper portions of the openings 322 to form the plugs 320 (i.e., semiconductor plugs, e.g., silicon plugs) and so that a pocket 331 of trapped air, of trapped gas or under vacuum is in the lower portions of the openings and further contained in the cavities 332(*a*)-(*b*), thereby providing the insulator material for the insulator-containing cavities.

Optionally, to avoid relying on the interface between a crystallized bottom section and an amorphized and recrystallized top section of each end wall to provide electrical isolation between the upper semiconductor layer and the semiconductor substrate (or, if present, the optional lower semiconductor layer), additional processing can be performed to selectively remove the end walls and exemplary resulting structures are shown in FIGS. 4A-4B and 5A-5B. That is, the semiconductor structure embodiment 300B shown in FIG. 3B could be a partially completed semiconductor structure formed during manufacture of the semiconductor structure embodiments 400A and 400B shown in FIGS. 4A and 4B or formed during manufacture of the semiconductor structure embodiments 500A and 500B of FIGS. 5A and 5B.

Specifically, the semiconductor structure embodiments 400A and 400B shown in FIGS. 4A and 4B and the semiconductor structure embodiment 500A and 500B shown in FIGS. 5A-5B can each include a semiconductor-on-insulator region 410, 510. The semiconductor-on-insulator region 410, 510 can include an optional lower semiconductor layer 411, 511 on a semiconductor substrate 401, 501; an upper semiconductor layer 413, 513 aligned above; and insulator-containing cavities 432(*a*)-(*b*), 532(*a*)-(*b*) physically separating the semiconductor substrate 401, 501 (or, if present, the optional lower semiconductor layer 411, 511) from the upper semiconductor layer 413, 513. Openings 422, 522 can extend vertically from the top surface of the upper semiconductor layer 413, 513 to the semiconductor substrate 401, 501 and the above-mentioned cavities 432(*a*)-(*b*), 532(*a*)-(*b*) can extend laterally off the sides of the openings 422, 522. An epitaxial semiconductor layer 425, 525 (e.g., an epitaxial silicon layer) can be on a top surface of the upper semiconductor layer 413, 513. The epitaxial semiconductor layer 425, 525 can further be in the openings 422, 522 on vertical surfaces of the upper semiconductor layer 413, 513, on vertical surfaces of the optional lower semiconductor layer 411, 511 (if present), and on the top surface of the semiconductor substrate 401, 501. The epitaxial semiconductor layer 425, 525 can further be within the cavities 432(*a*)-(*b*), 532(*a*)-(*b*) on the bottom surface of the upper semiconductor layer 413, 513 and on the top surface of the semiconductor substrate 401, 501 (or on the top surface of the optional lower semiconductor layer 411, 511, if present). In any given cavity (e.g., 432(*a*) or 432(*b*), 532(*a*) or 532(*b*)), the lower and upper segments of the epitaxial semiconductor layer 425, 525 on the bottom and top, respectively, of the cavity are physically separated by a first space with a first height. Furthermore, between any two adjacent cavities (e.g., 432(*a*) and 432(*b*), 532(*a*) and 532(*b*)), side-by-side lower segments of the epitaxial semiconductor layer 425, 525 on the bottoms of the adjacent cavities and side-by-side upper segments of the epitaxial semiconductor layer 425, 525 on the bottoms of the adjacent cavities are disconnected and, particularly, physically separated by a second space with a second height that is greater than the first height.

The semiconductor-on-insulator region 410 of the semiconductor structure embodiments 400A and 400B shown in FIGS. 4A and 4B can further include additional openings 423 that extend vertically through the epitaxial semiconductor material in the openings 422. These additional openings 423 are employed during processing to allow end walls (i.e., remaining portions of the sacrificial semiconductor layer) between adjacent cavities (e.g., see adjacent cavities 432(*a*)-432(*b*)) to be selectively removed. The additional openings 423, the first space between the lower and upper segments of the epitaxial semiconductor layer 425 within each cavity, and the second space from which an end wall was removed between adjacent cavities 432(*a*) and 432(*b*) can all be completely filled with a conformal dielectric layer 430 (e.g., see the semiconductor structure embodiment 400A of FIG. 4A). Optionally, the conformal dielectric layer 430 can pinch off during deposition so that pockets 431 of trapped air, of trapped gas or under vacuum in the openings, the cavities and/or in the second space (e.g., see pocket 431 within the second space between the cavities 432(*a*)-(*b*) in the semiconductor structure embodiment 400B of FIG. 4B). Thus, each plug 420 in the semiconductor structure embodiments 400A-400B includes an upper section, which is within an upper portion of an opening 422 and which comprises conformal dielectric material of layer 430 laterally surrounded by epitaxial semiconductor material of layer 425; and a lower section, which is below the upper section and which includes conformal dielectric material of layer 430.

The semiconductor-on-insulator region 510 of the semiconductor structure embodiments 500A and 500B shown in FIGS. 5A and 5B can further include one or more additional opening(s) 523. Each opening 523 (only one is shown) extends vertically through the epitaxial semiconductor material within an opening 522. As illustrated, there are fewer additional openings 523 than openings 522. The additional opening(s) 523 are employed during processing to allow end walls (i.e., remaining portions of the sacrificial semiconductor layer) between adjacent cavities (e.g., see adjacent cavities 532(*a*)-532(*b*)) to be selectively removed. The additional opening(s) 523, the first space between the lower and upper segments of the epitaxial semiconductor layer 525 within each cavity and the second space from which an end wall was removed between adjacent cavities 532(*a*) and 532(*b*) can all be completely filled with a conformal dielectric layer 530 (e.g., see the semiconductor structure embodiment 500A of FIG. 5A). Optionally, the conformal dielectric layer 530 can pinch off during deposition so that a pocket 531 of trapped air, of trapped gas or under vacuum is in the openings, the cavities and/or in the second space (e.g., see the pocket 531 within the second space between the cavities 532(*a*)-(*b*) in the semiconductor structure embodiment 500B of FIG. 5B). Thus, at least one plug 520(*a*) includes an upper section, which is within an upper portion of an opening 522 and which comprises conformal dielectric material of layer 530 laterally surrounded by epitaxial semiconductor material of layer 525; and a lower section, which is below the upper section and which includes conformal dielectric material of layer 530. However, at least one other plug 520(*b*) includes epitaxial semiconductor material of the layer 525, which fills the upper portion of an opening 522.

As mentioned above, in addition to having a semiconductor-on-insulator region 110, 210, 310, 410, each of the semiconductor structure embodiments 100A-100D, 200A-200D, 300A-300B, 400A-400B and 500A-500B can further include a support structure 190, 290, 390, 490, 590 above the semiconductor substrate 101, 201, 301, 401, 501 and laterally surrounding v the semiconductor-on-insulator-region 110, 210, 310, 410. This support structure 190, 290, 390, 490, 590 can specifically provide structural support for the upper semiconductor layer 113, 213, 313, 413, 513 above the cavities during processing following cavity formation.

Figure 6A:
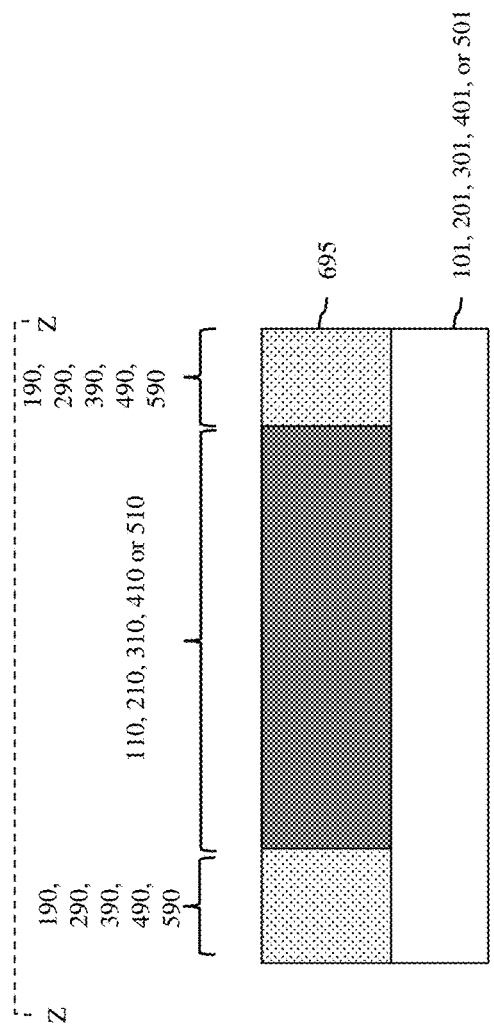
FIGS. 6A-6B are cross-section and top view diagrams of an exemplary support structure that can be incorporated into any of the embodiments in FIGS. 1A-5B.
Figure 6B:
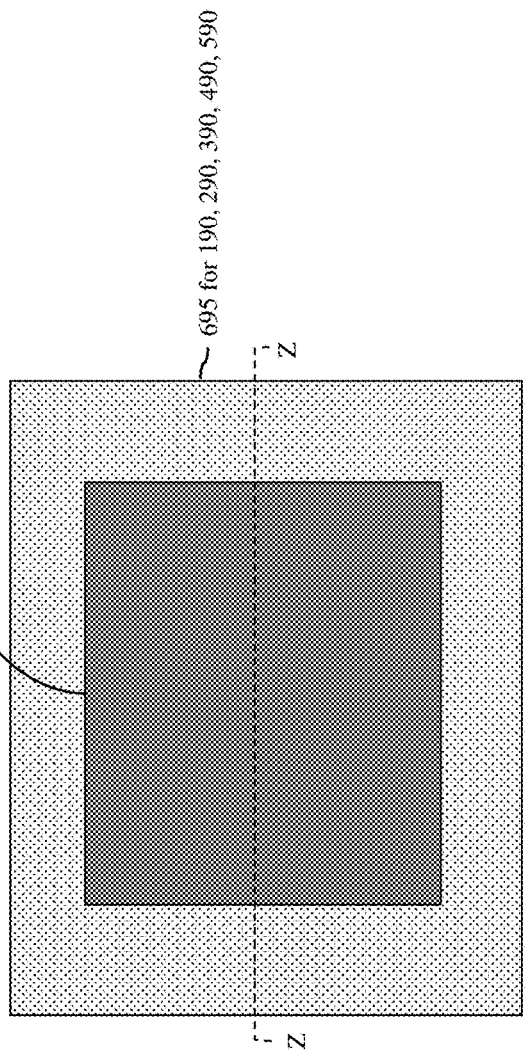

In some embodiments, this support structure 190, 290, 390, 490, 590 can be an isolation region 695 (e.g., a silicon oxide isolation region or some other suitable isolation region) on the bulk semiconductor substrate 101, 201, 301, 401, 501 and laterally surrounding and immediately adjacent to the semiconductor-on-insulator region 110, 210, 310, 410, 510 (see the cross-section and top view diagrams of FIGS. 6A-6B). For example, any of the above-described semiconductor structure embodiments could include a blanket dielectric layer (e.g., a blanket silicon dioxide layer or some other blanket dielectric layer) on the top surface of the semiconductor substrate. The blanket dielectric layer can include a trench that extends vertically to the top surface of the semiconductor substrate and the semiconductor-on-insulator region can be contained within and immediately adjacent to the sidewalls of that trench. Thus, the support structure is essentially an isolation region 695, which laterally surrounds and is immediately adjacent to the semiconductor-on-insulator region so as to provide support to the upper semiconductor layer.

Figure 7A:
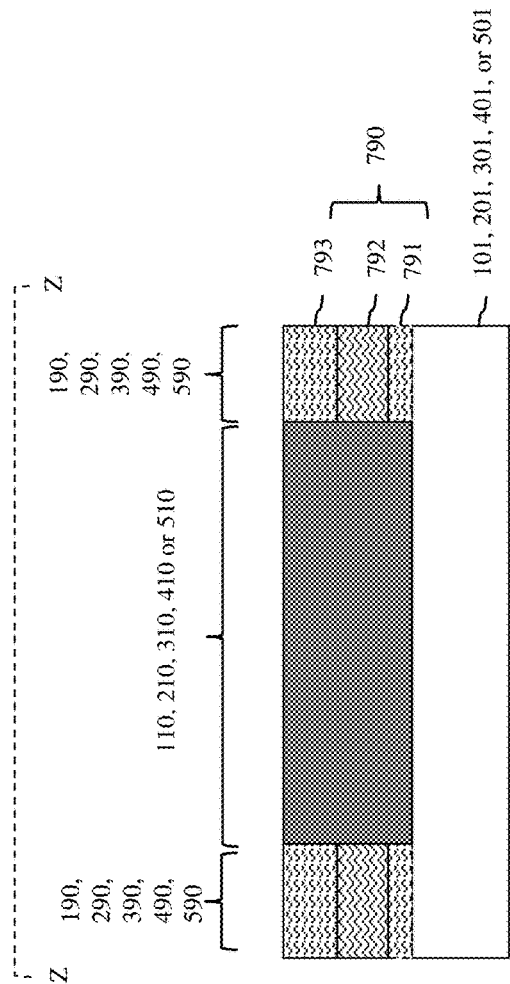
FIGS. 7A-7B are cross-section and top view diagrams of another exemplary support structure that can be incorporated into any of the embodiments in FIGS. 1A-5B.
Figure 7B:
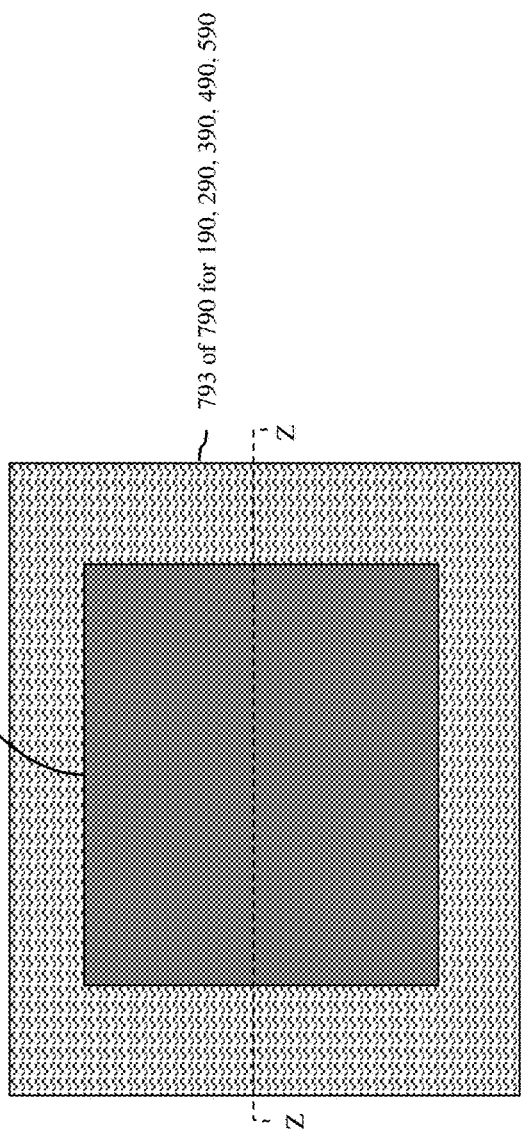

In other embodiments, the support structure 190, 290, 390, 490, 590 can be a stacked semiconductor region 790, which is on the bulk semiconductor substrate 101, 201, 301, 401, 501 and which laterally surrounds and immediately adjacent to the semiconductor-on-insulator region 110, 210, 310, 410, 510 (see the cross-section and top view diagrams of FIGS. 7A-7B). For example, any of the above-described semiconductor structure embodiments could include multiple semiconductor layers, which are stacked on the top surface of the semiconductor substrate. During processing, the semiconductor-on-insulator region could be formed in a designated area such that outer edge portions of the semiconductor layers (i.e., portions of the semiconductor layers outside the designated area) remain intact, thereby leaving a stacked semiconductor region 790 laterally surrounding and immediately adjacent to semiconductor-on-insulator region. This stacked semiconductor region 790 can include an optional lower semiconductor layer 791 (e.g., an outer edge portion of the same optional lower semiconductor layer used in the semiconductor-on-insulator region). The stacked semiconductor region 790 can further include an upper semiconductor layer 792 (e.g., an outer edge portion of the same upper semiconductor layer used in the semiconductor-on-insulator region). The stacked semiconductor region 790 can further include an additional semiconductor layer 792 (e.g., an outer edge portion of the sacrificial semiconductor layer within which the cavities are formed during semiconductor-on-insulator formation). The semiconductor material of the additional semiconductor layer 792 can be different from that of the semiconductor substrate (or, if present, the optional lower semiconductor layer 791) and the upper semiconductor layer 793.

In still other embodiments, the support structure 190, 290, 390, 490, 590 can be an isolation region 895, which is on the bulk semiconductor substrate 101, 201, 301, 401, 501, which laterally surrounds and is immediately adjacent to the semiconductor-on-insulator region 110, 210, 310, 410, 510, and which further physically separates the semiconductor-on-insulator region 110, 210, 310, 410, 510 from a stacked semiconductor region 890 (see the cross-section and top view diagrams of FIGS. 8A-8B). For example, any of the above-described semiconductor structure embodiments could include multiple semiconductor layers, which are stacked on the top surface of the semiconductor substrate. A trench isolation region 895 can extend vertically through the multiple semiconductor layers and can define a designated area for the semiconductor-on-insulator region. During processing, the semiconductor-on-insulator region could be formed in the designated area defined by the trench isolation region 895. Furthermore, outer edge portions of the semiconductor layers (i.e., portions of the semiconductor layers outside the designated area and physically separated form the semiconductor-on-insulator region by the trench isolation region 895) remain intact, thereby leaving a stacked semiconductor region 890. This stacked semiconductor region 890 can include an optional lower semiconductor layer 891 (e.g., an outer edge portion of the same optional lower semiconductor layer used in the semiconductor-on-insulator region). The stacked semiconductor region 890 can further include an upper semiconductor layer 892 (e.g., an outer edge portion of the same upper semiconductor layer used in the semiconductor-on-insulator region). The stacked semiconductor region 890 can further include an additional semiconductor layer 892 (e.g., an outer edge portion of the sacrificial semiconductor layer within which the cavities are formed during semiconductor-on-insulator formation). The semiconductor material of the additional semiconductor layer 892 can be different from that of the semiconductor substrate (or, if present, the optional lower semiconductor layer 891) and the upper semiconductor layer 893.

As mentioned above, the semiconductor structure embodiments 100B-100E, 200B-200E, 300A-300B, 400B and 500B all include one or more pockets 131, 231, 331, 431, 531 of trapped air, of trapped gas or under vacuum in the openings and/or cavities. The dielectric constant of air is approximately one such that it is considered an insulator material. In embodiments where the pockets include trapped gas, the gas can include one or more different types of process gases (e.g., nitrogen, argon, etc.) that similarly have a relatively low dielectric constant of approximately one so as to be considered an insulator material. In embodiments where the pockets are under vacuum, they do not contain an insulator material per se but since the dielectric constant of a perfect vacuum is exactly one such pockets effectively function as an insulator material.

It should be understood that the semiconductor structure embodiments 100A-100E, 200A-200E, 300A-300B, 400A-400B and 500A-500B are provided for illustration purposes and are not intended to be limiting. For example, in each of the semiconductor structure embodiments 100A-100E, 200A-200E, 300A-300B, 400A-400B and 500A-500B, the shapes of the openings 122, 222, 322, 422, 522 are all rectangular and the sizes of the openings are all the same. However, optionally, in other semiconductor structure embodiments (not shown) the shapes of adjacent openings could be different (e.g., circular and square, oval and rectangular, etc.) and/or the sizes of adjacent openings 122, 222, 322, 422, 522 could be different. Those skilled in the art will recognize that the amount of dielectric fill material (including the size and presence of any pocket of trapped air, trapped gas or under vacuum) in a given cavity will be a function of the thickness material deposited into the cavity during processing as well as the shape and size of the opening. For example, in a smaller opening and/or in an opening with corners (e.g., a square or rectangular opening), deposited dielectric fill material may pinch off earlier than it would in a larger opening and/or in an opening without corners (e.g., a round or oval opening), thereby leaving a larger pocket within the corresponding cavity and vice versa. In these other semiconductor structure embodiments where the shapes and/or sizes of the openings to the cavities are different any of the following could occur: (a) the sizes of the pockets in adjacent cavities could be different; (b) one cavity could have pocket and another may not; (c) the sizes of different portions of a pocket in merged cavities could be different; (d) one portion of a merged cavity may have a pocket and another may not; etc.

Referring to the flow diagram of FIGS. 9A-9F, also disclosed herein are embodiments of a method of forming the above-described semiconductor structure embodiments 100A-100E, 200A-200E, 300A-300B, 400A-400B, and 500A-500B.

The method embodiments can include providing a bulk semiconductor substrate 101, 201, 301, 401, 501 (see process step 902 and FIG. 10). This bulk semiconductor substrate can be, for example, a bulk silicon substrate or a bulk semiconductor substrate of some other suitable monocrystalline semiconductor material (e.g., silicon germanium, etc.).

The method embodiments can further include forming at least one semiconductor-on-insulator region 110, 210, 310, 410, 510 in a designated area above the semiconductor substrate 101, 201, 301, 401, 501 (see process step 904). Process step 904 can specifically be performed so that the semiconductor-on-insulator region 110, 210, 310, 410, 510 includes multiple openings 122, 222, 322, 422, 522, which extend therethrough to the semiconductor substrate 101, 201, 301, 401, 501; an upper semiconductor layer 113, 213, 313, 413, 513 above and physically separated from the semiconductor substrate 101, 201, 301, 401, 501 by insulator-containing cavities 132(a)-(b), 232(a)-(b), 332(a)-(b), 432(a)-(b), 532(a)-(b), which extend laterally from sides of the openings; and plugs 120, 220, 320, 420, 520, which fill at least the upper portions of the openings 122, 222, 322, 422, 522 (i.e., the portions of the openings that extend through the upper semiconductor layer). Optionally, this process step 904 can be performed so that so that the semiconductor-on-insulator region 110, 210, 310, 410, 510 further includes a lower semiconductor layer 111, 211, 311, 411, 511 stacked between the semiconductor substrate 101, 201, 301, 401, 501 and the insulator-containing cavities 132(a)-(b), 232(a)-(b), 332(a)-(b), 432(a)-(b), 532(a)-(b).

Figure 9A:
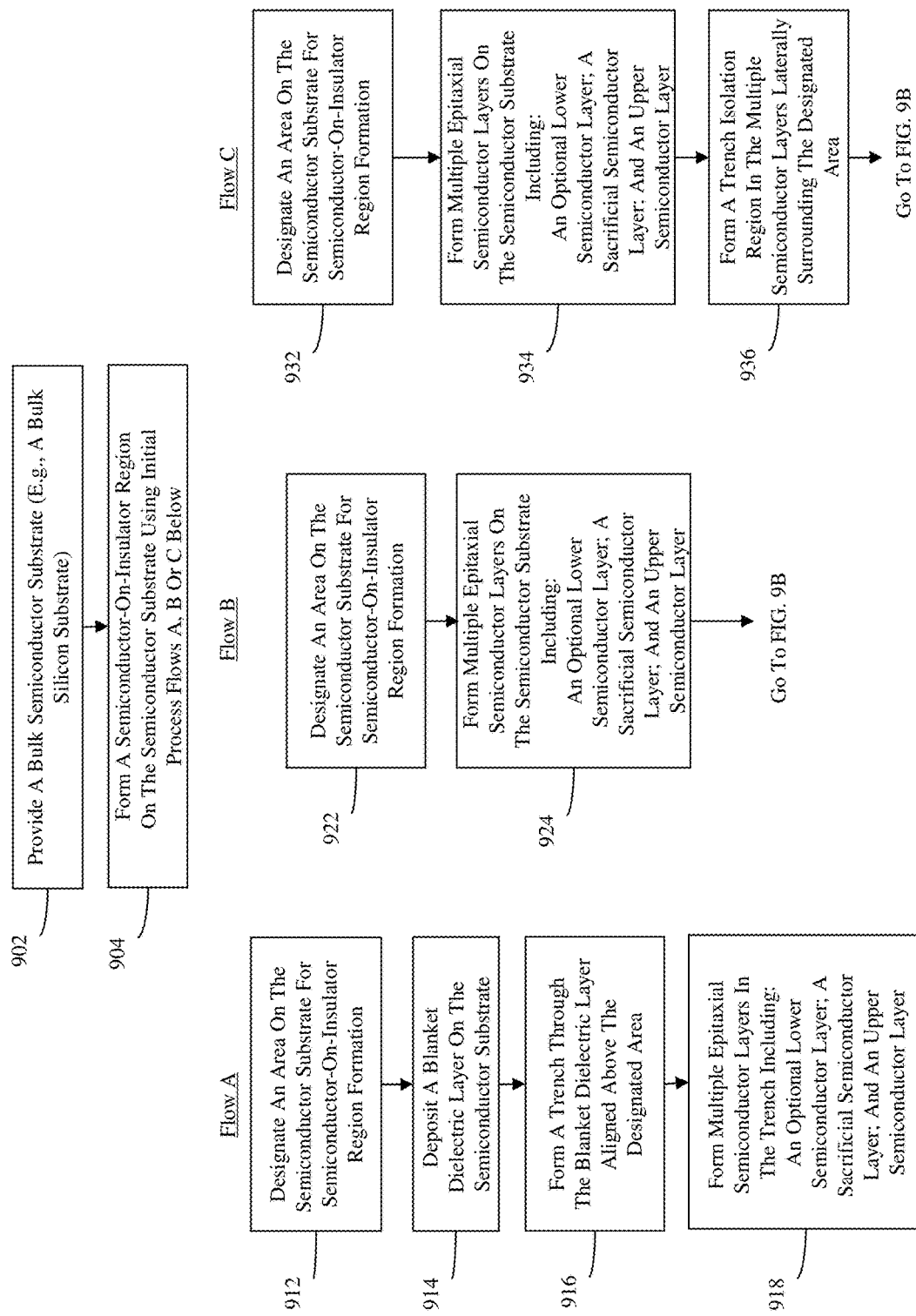

More specifically, as shown in FIG. 9A, in order to form semiconductor-on-insulator region(s) 110, 210, 310, 410, 510 on a semiconductor substrate 101, 201, 301, 401, 501 at process step 904 preliminary process flow A, B or C can initially be performed.

Figure 11B:
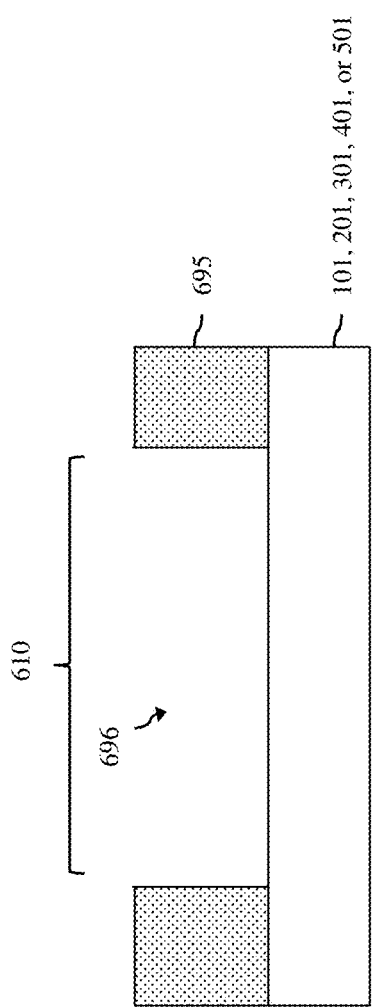
Figure 11C:
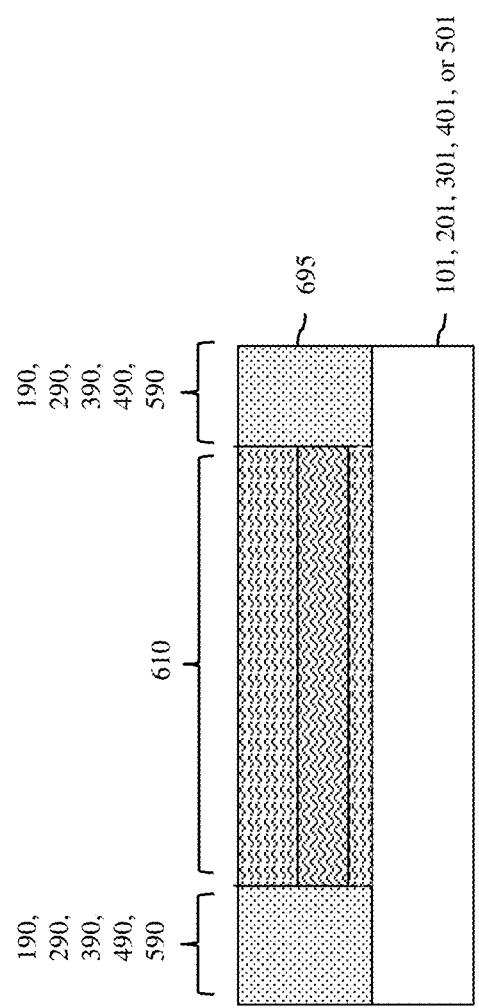

According to preliminary process flow A, an area 610 on the semiconductor substrate 101, 201, 301, 401, 501 can be designated for formation of the semiconductor-on-insulator region 110, 210, 310, 410, 510 (see process step 912). Then, a blanket dielectric layer 690 (e.g., a blanket silicon dioxide layer or some other blanket dielectric layer) can be deposited onto the top surface of the semiconductor substrate 101, 201, 301, 401, 501 (see process step 914 and FIG. 11A). Next, a trench 696 can be formed (e.g., lithographically patterned and etched) in the dielectric layer 690 so that it extends vertically through the dielectric layer and exposes the top surface of the semiconductor substrate in the designated area 610 (see process step 916 and FIG. 11B). Multiple epitaxial semiconductor layers can then be formed within the trench 696 (see process step 918 and FIG. 11C). The remaining portion of the dielectric layer 690, which laterally surrounds and is immediately adjacent to the stack of semiconductor layers within the trench 696, is an isolation region 695 that effectively functions as a support structure 190, 290, 390, 490, 590 when the semiconductor layers within the designated area 610 are subsequently processed to form the semiconductor-on-insulator region.

Figure 12:
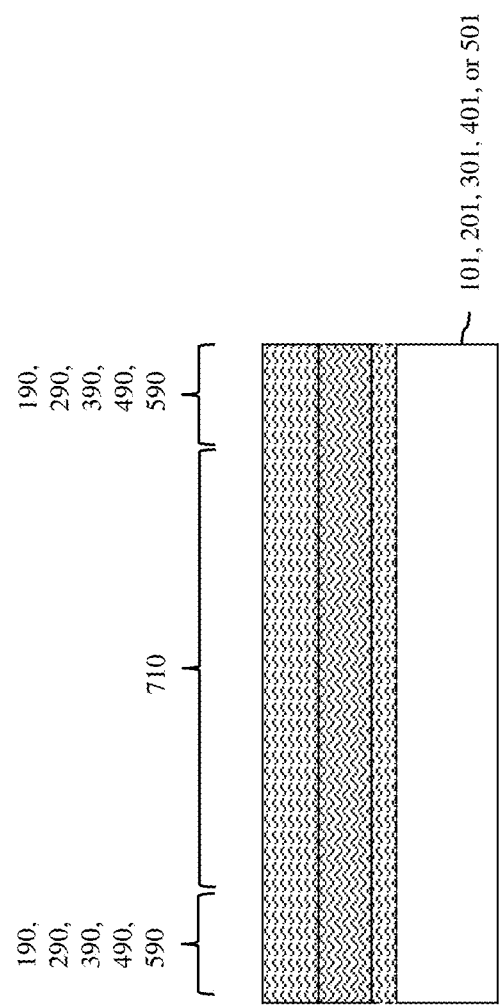
FIG. 12 is a cross-section diagram illustrating a partially completed structure formed during process flow B of FIG. 9A.

According to preliminary process flow B, an area 710 on the semiconductor substrate 101, 201, 301, 401, 501 can be designated for formation of the semiconductor-on-insulator region 110, 210, 310, 410, 510 (see process step 922). Multiple epitaxial semiconductor layers can then be formed on the top surface of the semiconductor substrate 101, 201, 301, 401, 501 (see process step 924 and FIG. 12). The outer edge portion of the stack of semiconductor layers, which laterally surrounds and is immediately adjacent to the designated area for semiconductor-on-insulator region formation, is a stacked semiconductor region that effectively functions as a support structure 190, 290, 390, 490, 590 when the semiconductor layers within the designated area 710 are subsequently processed to form the semiconductor-on-insulator region.

Figure 13A:
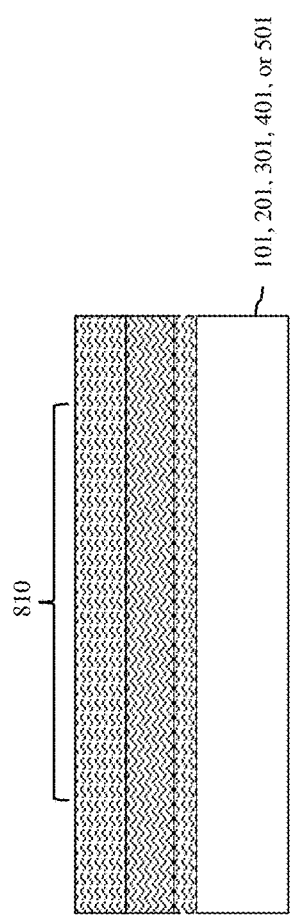
FIGS. 13A-13C are cross-section diagram illustrating partially completed structures formed during process flow C of FIG. 9A.
Figure 13B:
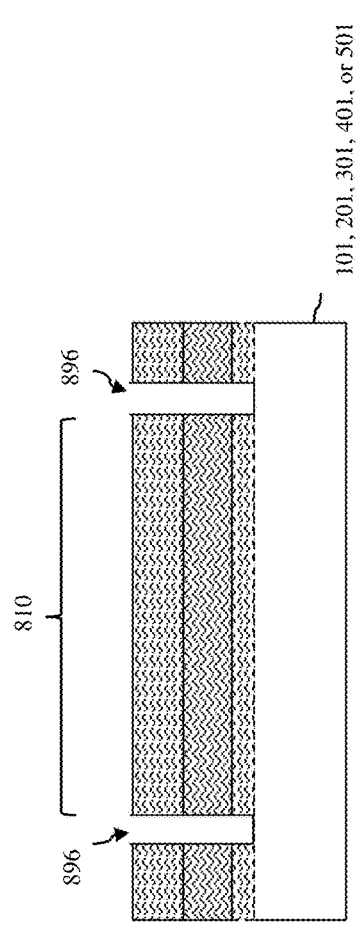
Figure 13C:
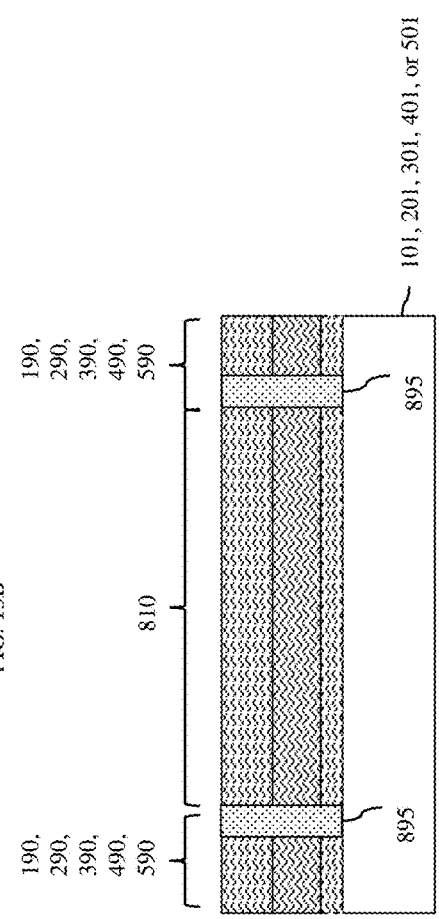

According to preliminary process flow C, an area 810 on the semiconductor substrate 101, 201, 301, 401, 501 can be designated for formation of the semiconductor-on-insulator region 110, 210, 310, 410, 510 (see process step 932 and FIG. 13A). Multiple epitaxial semiconductor layers can then be formed on the top surface of the semiconductor substrate 101, 201, 301, 401, 501 (see process step 934 and FIG. 13A). Next, a trench isolation region 895 can be formed in the semiconductor layers around the designated area 810 (see process step 936 and FIGS. 13B-13C). Specifically, trenches 896 can be formed (e.g., lithographically patterned and etched) so as to laterally surround and be immediately adjacent to the portion of the semiconductor layers within the designated area 810. The trenches can subsequently be filled with an isolation material, thereby forming the trench isolation regions 895. This trench isolation region 895 effectively functions as a support structure 190, 290, 390, 490, 590 when the semiconductor layers within the designated area 810 are subsequently processed to form the semiconductor-on-insulator region.

It should be noted that in each of the above-described process flows A, B and C, the multiple epitaxial semiconductor layers can include: an optional lower semiconductor layer 111, 211, 311, 411, 511; a sacrificial semiconductor layer 112, 212, 312, 412, 512 on the semiconductor substrate (or on the optional lower semiconductor layer, if formed); and an upper semiconductor layer 113, 213, 313, 413, 513 on the sacrificial semiconductor layer 112, 212, 312, 412, 512. The semiconductor material of the sacrificial semiconductor layer can be different from that of the upper semiconductor layer and the semiconductor substrate or the optional lower semiconductor layer (if formed). The difference between the semiconductor material of the sacrificial semiconductor layer and the semiconductor material(s) of the upper semiconductor layer, semiconductor substrate and optional lower semiconductor layer (if formed) must be sufficient to allow the sacrificial semiconductor layer to be selectively etched during subsequent processing. Thus, for example, the semiconductor substrate, the optional lower semiconductor layer (if formed) and the upper semiconductor layer can be silicon and the sacrificial semiconductor layer can be silicon germanium with 25-60% germanium (e.g., SiGe35) or vice versa. Alternatively, all of the layers can be silicon germanium, but the sacrificial semiconductor layer can have sufficiently different germanium concentration (e.g., a relatively high or relatively low germanium concentration) to allow the sacrificial semiconductor layer to be selectively etched. Alternatively, the semiconductor material of the sacrificial semiconductor layer could be otherwise sufficiently different to allow the sacrificial semiconductor layer to be selectively etched.

The partially completed semiconductor structure following preliminary process flow A, B or C will include a bulk semiconductor substrate 101, 201, 301, 401, 501 and, on the substrate, a support structure 190, 290, 390, 490, 590 that laterally surrounds and is immediately adjacent to multiple epitaxial semiconductor layers within a designated area (e.g., 610, 710, or 810) for semiconductor-on-insulator region formation (see FIG. 14). As mentioned above, the multiple epitaxial semiconductor layers can include: an optional lower semiconductor layer 111, 211, 311, 411, 511; a sacrificial semiconductor layer 112, 212, 312, 412, 512 on the semiconductor substrate (or optional lower semiconductor layer); and an upper semiconductor layer 113, 213, 313, 413, 513 on the sacrificial semiconductor layer 112, 212, 312, 412, 512.

Figure 9B:
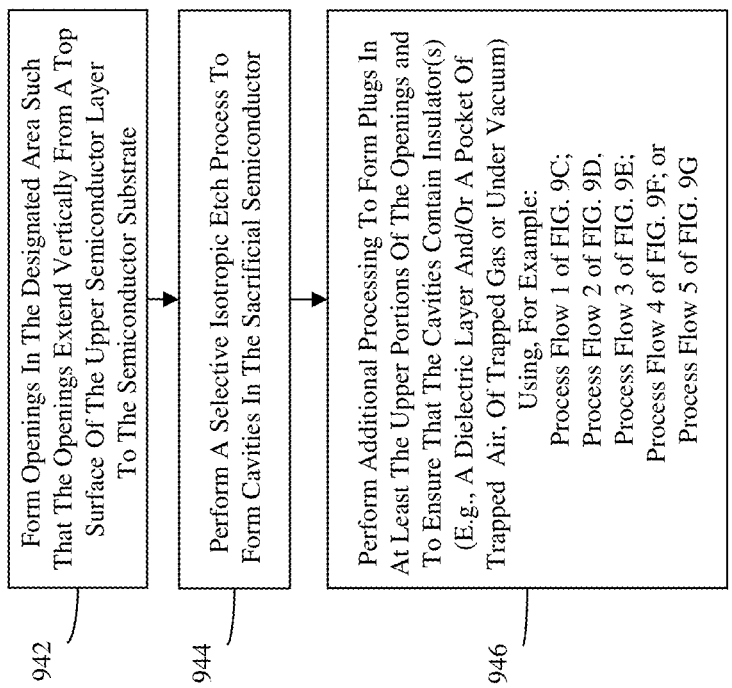

Referring to FIG. 9B, once the preliminary process flow A, B or C is completed, openings 122, 222, 322, 422, 522 can be formed through the multiple epitaxial semiconductor layers within the designated area (see process step 942 and FIGS. 15A-15B). These openings 122, 222, 322, 422, 522 can, for example, be lithographically patterned and etched so that they extend vertically from the top surface of the upper semiconductor layer 113, 213, 413, 513 down through the sacrificial semiconductor layer 112, 212, 312, 412, 512 and, if present, the optional lower semiconductor layer 111, 211, 311, 411, 511 to the semiconductor substrate 101, 201, 301, 410, 501. For purposes of illustration, four rectangular-shaped openings are shown in the top view diagram of FIG. 15B. However, the figures are not intended to be limiting. Alternatively, any number of two or more openings could be formed. Alternatively, the openings could have any other suitable shape (e.g., a circular shape, a hexagon shape, an octagon shape, etc.). As illustrated, the openings 122, 222, 322, 422, 522 will expose vertical surfaces of the sacrificial semiconductor layer 112, 212, 312, 412, 512 at the sides of the openings just below the upper semiconductor layer 113, 213, 313, 413, 513.

Figure 16:
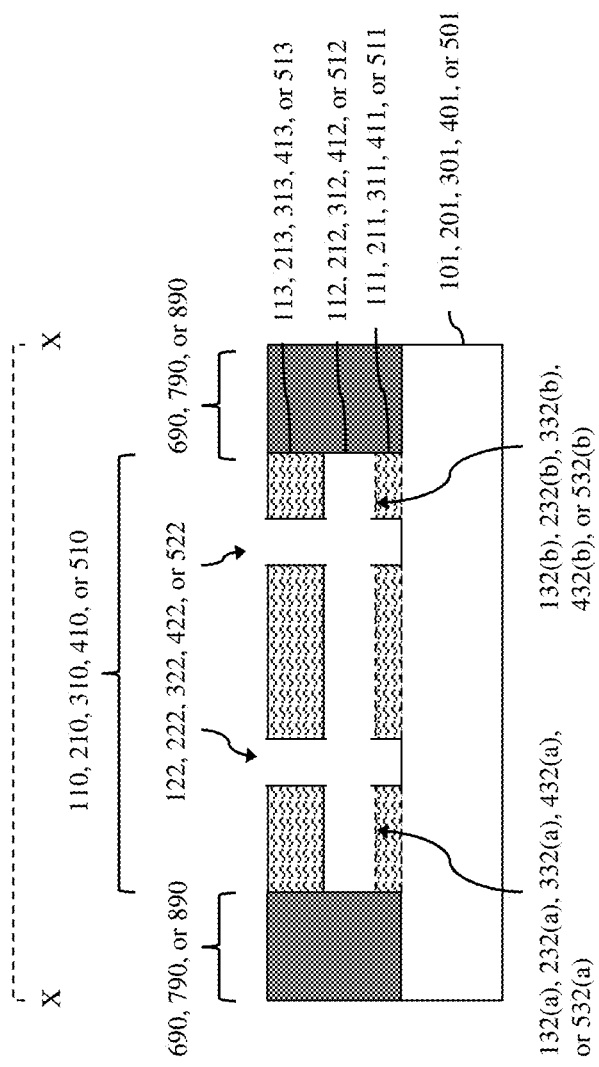
FIG. 16 is a cross-section diagram illustrating a partially completed structure formed at process step 944 of FIG. 9B.
Figure 17:
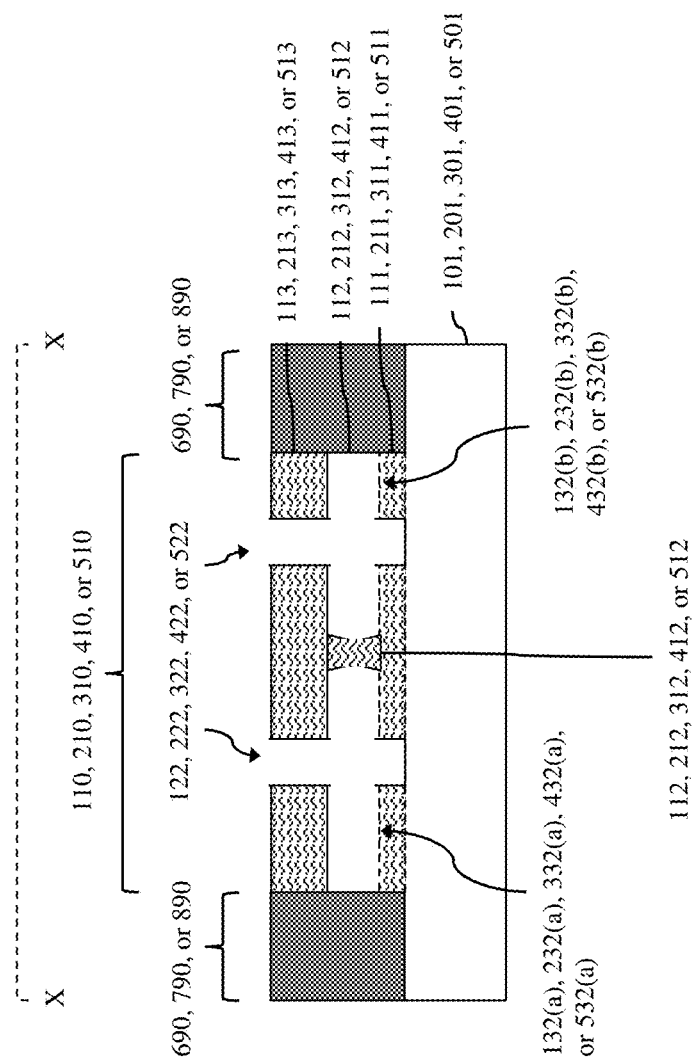
FIG. 17 is a cross-section diagram illustrating an alternative partially completed structure formed at process step 944 of FIG. 9B.

Next, a selective etch process can be performed in order to laterally etch back the exposed vertical surfaces of the sacrificial semiconductor layer 112, 212, 312, 412, 512 within each opening 122, 222, 322, 422, 522, thereby forming cavities 132(a)-(b), 232(a)-(b), 332(a)-(b), 432(a)-(b), 532(a)-(b) (see process step 944 and FIG. 16 or 17). For purposes of this disclosure, a selective etch process refers to an etch technique that preferentially removes a particular exposed material (in this case the semiconductor material of the sacrificial semiconductor layer) while leaving other exposed materials (in this case the semiconductor materials of the upper and lower semiconductor layers and any STI isolation materials) essentially intact by either not etching those materials or etching them at a significantly slower rate. In preferred embodiments, the selective etch process could be a selective isotropic etch process. Alternatively, the selective etch process could include selective anisotropic etch process(es) or a combination of selective anisotropic and isotropic etch processes. For purposes of this disclosure, a selective isotropic etch process is an etch technique that preferentially removes a particular material in all directions, whereas a selective anisotropic etch process is an etch technique that preferentially removes the particular material in a specific direction. In any case, process step 944 should be performed such that the resulting cavities extend laterally from the sides of the openings undercutting the upper semiconductor layer so that the cavities are stacked vertically between the semiconductor substrate 101, 201, 301, 401, 501 (or, if present, the optional lower semiconductor layer 111, 211, 311, 411, 511) and the upper semiconductor layer 113, 213, 313, 413, 513.

As mentioned above, in the preferred embodiments, the selective etch process could be a selective isotropic etch process. It should be understood that the specifications for the selective isotropic etch process can vary depending upon the semiconductor materials for the substrate and various semiconductor layers. For example, if the upper semiconductor layer and semiconductor substrate (or optional lower semiconductor layer, if present) are silicon and if the sacrificial semiconductor layer is silicon germanium, then the exposed silicon germanium surfaces of sacrificial semiconductor layer can be selectively etched over exposed silicon and dielectric surfaces using any of the following exemplary selective isotropic etch processes: a thermal etch process (e.g., using gaseous hydrochloric acid (HCl)), a dry plasma etch process, or a wet etch process with process specifications designed to ensure the selective isotropic etch of silicon germanium over silicon. Alternatively, any other suitable isotropic selective etch process that selectively etches silicon germanium could be used.

It should be understood that, while only two cavities (a) and (b) are shown in each cross-section drawing the resulting partially completed semiconductor structure will have the same number of cavities as openings. This number could be more than two (e.g., four, five, six, etc.). Furthermore, in some method embodiments, the selective etch process employed during cavity formation can be performed so that adjacent cavities (i.e., cavities that are etched laterally from the sides of adjacent openings) are merged into what is essentially a single relatively large cavity (as shown in FIG. 16). In other method embodiments, this selective etch process can be performed so that the adjacent cavities are physically separated by an end wall (i.e., a remaining portion of the sacrificial semiconductor layer 112, 212, 312, 412, 512) (as shown in FIG. 17). For example, the selective etch process can be timed so that etching stops prior to punching through the endwalls of the cavities. Alternatively, the selective etch process can be a self-limiting etch process that stops prior to punching through the endwalls of the cavities.

It should further be understood that, during cavity formation, the support structure (which laterally surrounds the designated area for semiconductor-on-insulator region formation) will support the upper semiconductor layer and, particularly, will prevent the upper semiconductor layer from collapsing into the cavities. If isolation regions are present in the support structure 190, 290, 390, 490, 590 (e.g., see isolation region 695 of FIG. 11C and 895 of FIG. 13C), the selective etch process used during cavity formation at process step 944 will leave the isolation regions intact, thereby limiting cavity size and maintaining the integrity of the support structure. If isolation regions are not present in the support structure (e.g., see the stacked semiconductor region around the designated area 710 for SOI formation in FIG. 12), the selective etch process can be performed so that the stacked semiconductor region remains intact in order to support the upper semiconductor layer following cavity formation. For example, the selective etch process can be timed to prevent etching of the sacrificial semiconductor layer outside the designated area for SOI region formation. Alternatively, a self-limiting selective etch process could be performed so as to prevent etching of the sacrificial semiconductor layer outside the designated area for SOI region formation.

Following cavity formation at process step 944, additional processing can be performed in order to form plugs 120, 220, 320, 420, 520 in at least the upper portions of the openings 122, 222, 322, 422, 522 (i.e., the portions of the openings that extend through the upper semiconductor layer 113, 213, 313, 413, 513) and to ensure that the cavities contain insulator(s) (e.g., a conformal dielectric layer and/or a pocket of trapped air, of trapped gas or under vacuum) (see process step 946). For purposes of this disclosure, a pocket under vacuum is an area or region or space that is devoid of matter. It should be understood that different process flows can be employed at process step 946 to form the different semiconductor structure embodiments described in detail above.

Figure 9C:
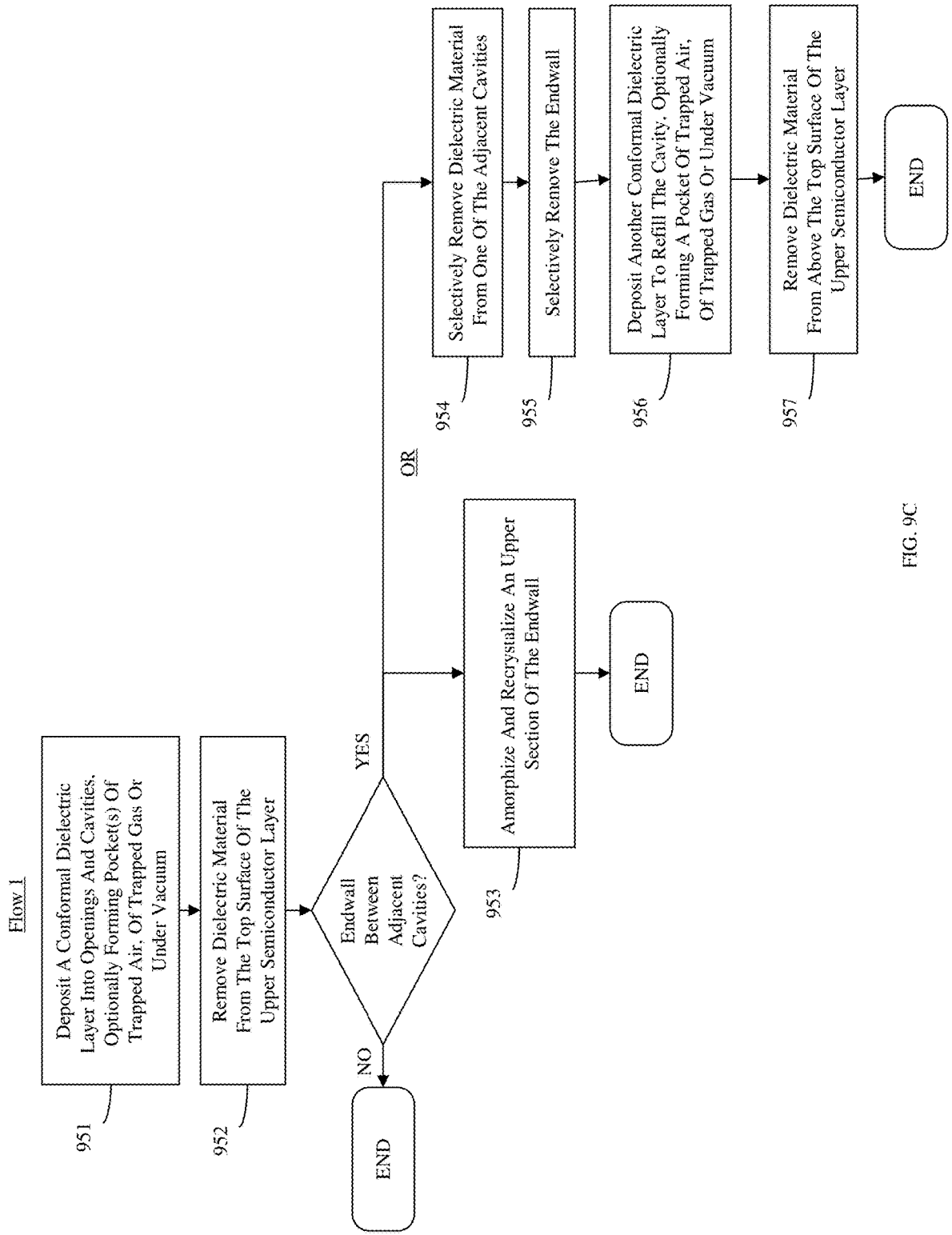

Specifically, process flow 1 of FIG. 9C can be employed to form the semiconductor structure embodiments 100A-100E of FIGS. 1A-1E. In this process flow 1, a conformal dielectric layer 130 (e.g., a conformal silicon dioxide layer or a conformal layer of some other suitable dielectric material) can be deposited so as to line the cavities 132(a)-(b) (which are either merged or physically separated) and the openings 122 (see process step 951). Depending upon the size of the openings, the size of the cavities (due to the thickness of the sacrificial semiconductor layer), and the thickness of the conformal dielectric layer 130, etc., the conformal dielectric layer 130 may or may not contained pockets of trapped air in the openings 122 and/or in the cavities 132(a)-(b). For example, the conformal dielectric layer 130 may be completely devoid of pockets of trapped air, of trapped gas or under vacuum (see the semiconductor structure embodiment 100A in FIG. 1A). Alternatively, during processing the conformal dielectric layer 130 may pinch off in the upper portions of the openings 122 before the cavities 132(a)-(b) and openings 122 are filled such that the conformal dielectric layer 130 contains a pocket 131 of trapped air, of trapped gas or under vacuum that extends laterally almost the full width of the semiconductor-on-insulator region 110 (see the semiconductor structure embodiment 100B of FIG. 1B). Alternatively, during processing the conformal dielectric layer 130 may pinch off in the upper portions of the openings 122 after the cavities 132(a)-(b) are filled but before the openings 122 are filled such that the conformal dielectric layer 130 contains pockets 131 of trapped air, of trapped gas or under vacuum in the openings 122 (i.e., in the plugs) (see the semiconductor structure embodiment 100C of FIG. 1C). Alternatively, during processing the conformal dielectric layer 130 may pinch off at one or more other locations with the openings 122 and/or cavities 132(a)-(b) (e.g., at the entrance to the cavities 132(a)-(b), etc.) leaving multiple pockets of trapped air, of trapped gas or under vacuum encapsulated by the conformal dielectric layer 130 in the cavities 132(a)-(b) and/or the openings 122 (not shown). Following deposition of the conformal dielectric layer 130, any dielectric material can be removed from the top surface of the upper semiconductor layer 113 (e.g., by using a chemical mechanical polishing (CMP) process and/or a selective etch process).

Figure 1B:
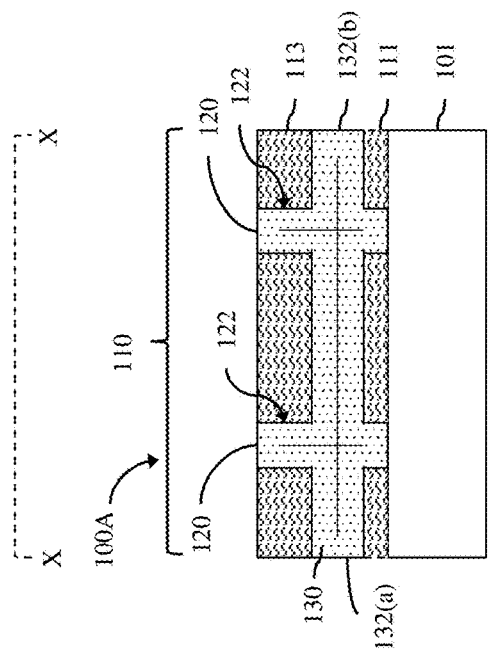
Figure 1C:
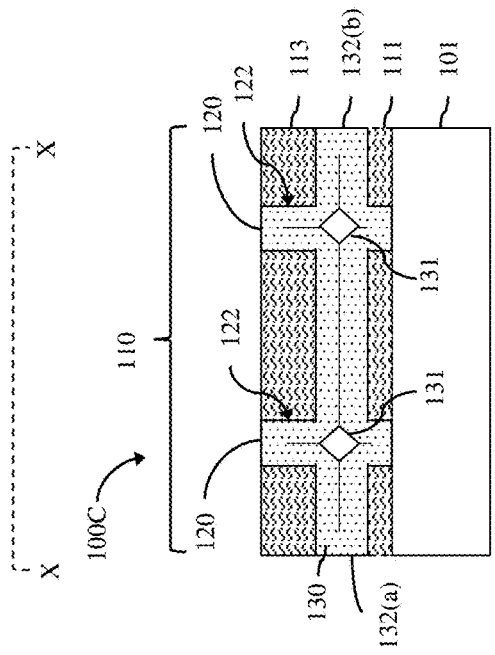
Figure 2A:
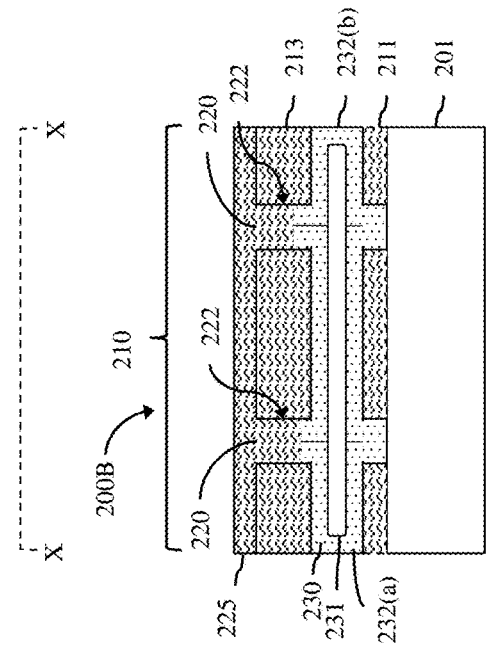
Figure 2B:
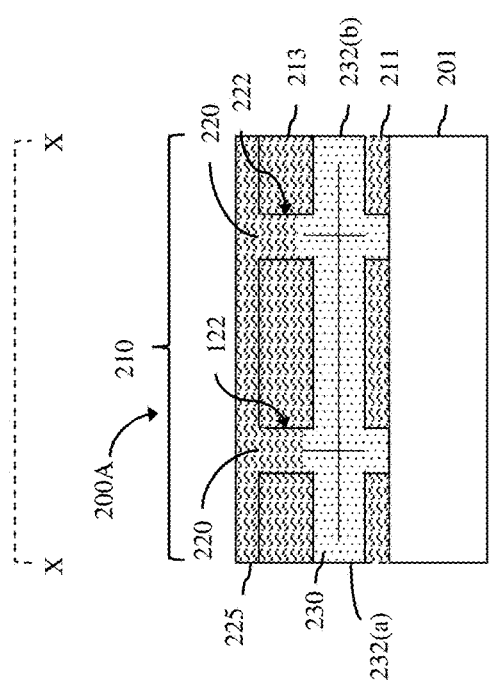
Figure 2C:
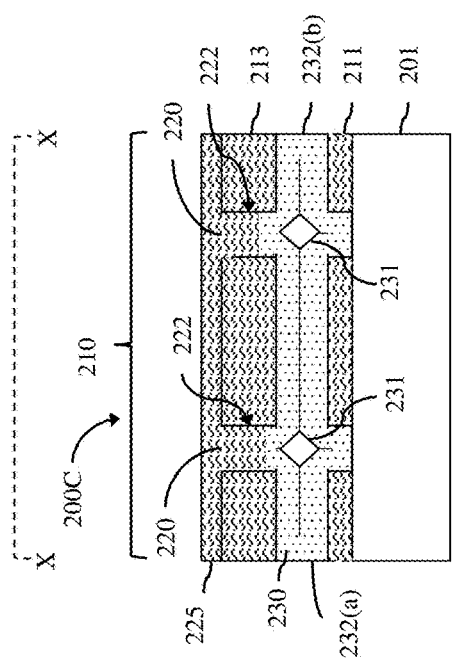

If adjacent cavities are merged (e.g., as in the semiconductor structure embodiments 100A-100C of FIGS. 1A-1C, respectively), process flow 1 ends. If adjacent cavities 132(a)-(b) are physically separated by an end wall comprising a remaining portion of the sacrificial semiconductor layer 112, additional processing is required in order to avoid shorting of the upper semiconductor layer 113 to the semiconductor substrate 101 (or, if present, to the optional lower semiconductor layer 111) through the end wall.

For example, this additional processing can include amorphizing and recrystallizing a top section of the end wall (see process step 953 and the semiconductor structure embodiment 100D of FIG. 1D). Specifically, at process step 953, an amorphization implant process can be performed whereby inert amorphization ions are implanted into the top section of the end wall so that it is amorphized. The inert amorphization ions can be, for example, Group IV ions (e.g., silicon ions, germanium ions, carbon ions or tin ions), Group 0 nobel gas ions (e.g., argon ions, krypton ions, xenon ions, and neon ions), nitrogen ions, oxygen ions, or any combination thereof. Then, a recrystallization anneal can be performed in order to recrystallize that top section. In this case, the interface between the crystallized bottom section and the amorphized and recrystallized top section provides the necessary electrical isolation.

Alternatively, the additional processing can include: selectively removing the conformal dielectric layer from one cavity (e.g., cavity 132(b)) (see process step 954); selectively removing the end wall (see process step 955); depositing another conformal dielectric layer 130' back into the cavity 132(b) such that the conformal dielectric layer 130' in the cavity 132(b) abuts the conformal dielectric layer 130 in cavity 132(a) (see process step 956); and removing the dielectric material from above the top surface of the upper semiconductor layer 113 using a CMP process and/or a selective etch process (see process step 957 and the semiconductor structure embodiment 100E of FIG. 1E). It should be noted that depending upon the size of the openings, the size of the cavities (due to the thickness of the sacrificial semiconductor layer), and the thicknesses of the conformal dielectric layers 130 and 130', etc., pockets of trapped air, of trapped gas or under vacuum may optionally be encapsulated by none, one or both of the conformal dielectric layers 130 and 130'. Furthermore, the dielectric material of the conformal dielectric layers 130 and 130' in the adjacent cavities may be different. For example, the conformal dielectric layer 130 could be silicon dioxide and the conformal dielectric layer 130' could be silicon nitride, silicon oxynitride, etc.

In any case, as a result of the process flow 1, the plugs 120 in the openings 122 will be insulator plugs that completely fill the openings 122. Additionally, the insulator material(s) of the plugs 120 and contained in the cavities 132(a)-(b) will be a dielectric material (e.g., a silicon dioxide or some other suitable dielectric material) and, optionally, a pocket 131 of trapped air, of trapped gas or under vacuum encapsulated within the dielectric material.

Figure 9D:
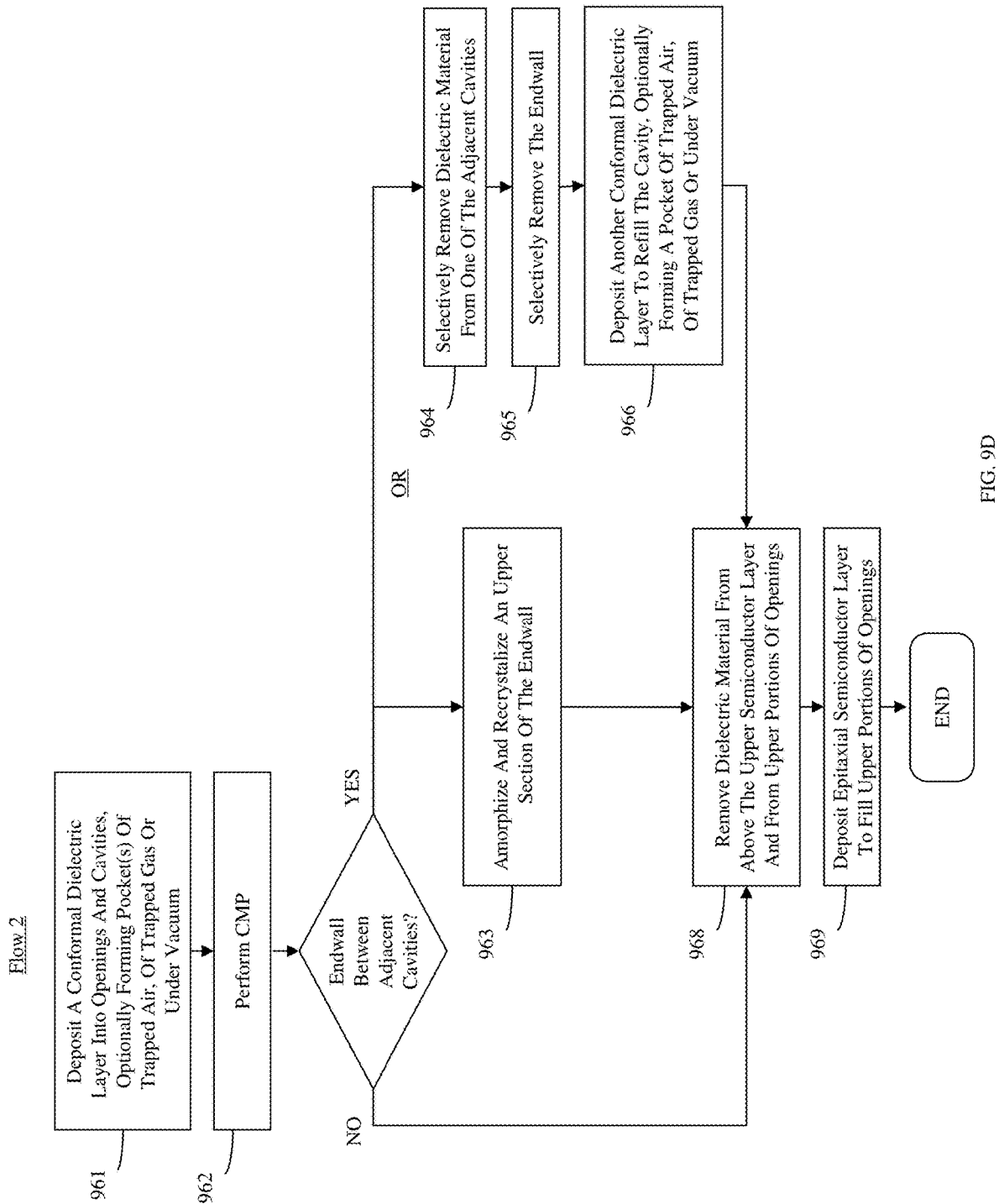

Process flow 2 of FIG. 9D can be employed to form the semiconductor structure embodiments 200A-200E of FIGS. 2A-2E. In this process flow 2, process steps 961-966 can be essentially the same as process steps 951-956 of the process flow 1, described above. Additional processing includes selectively removing dielectric material from above the top surface of the upper semiconductor layer and further from the upper portions of the openings 222 (see process step 968). For example, a selective etch process can be performed to etch back the dielectric material, thereby removing it from above the top surface of the upper semiconductor layer and also from the upper portions of the openings 222. Alternatively, a CMP process could first be performed followed by a selective etch process. Next, an epitaxial semiconductor layer 225 is deposited onto the top surface of the upper semiconductor layer 213 and onto the exposed vertical surfaces of the upper semiconductor layer 213 within the openings 222, thereby forming any of the semiconductor structure embodiments 200A-200E of FIGS.

2A-2E (see process step 969). A CMP process can subsequently be performed to planarize the semiconductor top surface. As a result of the process flow 2, the insulator material(s) contained in the cavities 232(*a*)-(*b*) will be a dielectric material (e.g., a silicon dioxide or some other suitable dielectric material) and, optionally, a pocket 231 of trapped air, of trapped gas or under vacuum encapsulated within the dielectric material. However, the plugs 220 in the openings 222 will be semiconductor-on-insulator plugs as opposed to just insulator plugs. That is, each plug 220 will have a semiconductor section that fills an upper portion of an opening 222 and an insulator section that fills a lower portion of the opening 222 below the upper portion.

Figure 9E:
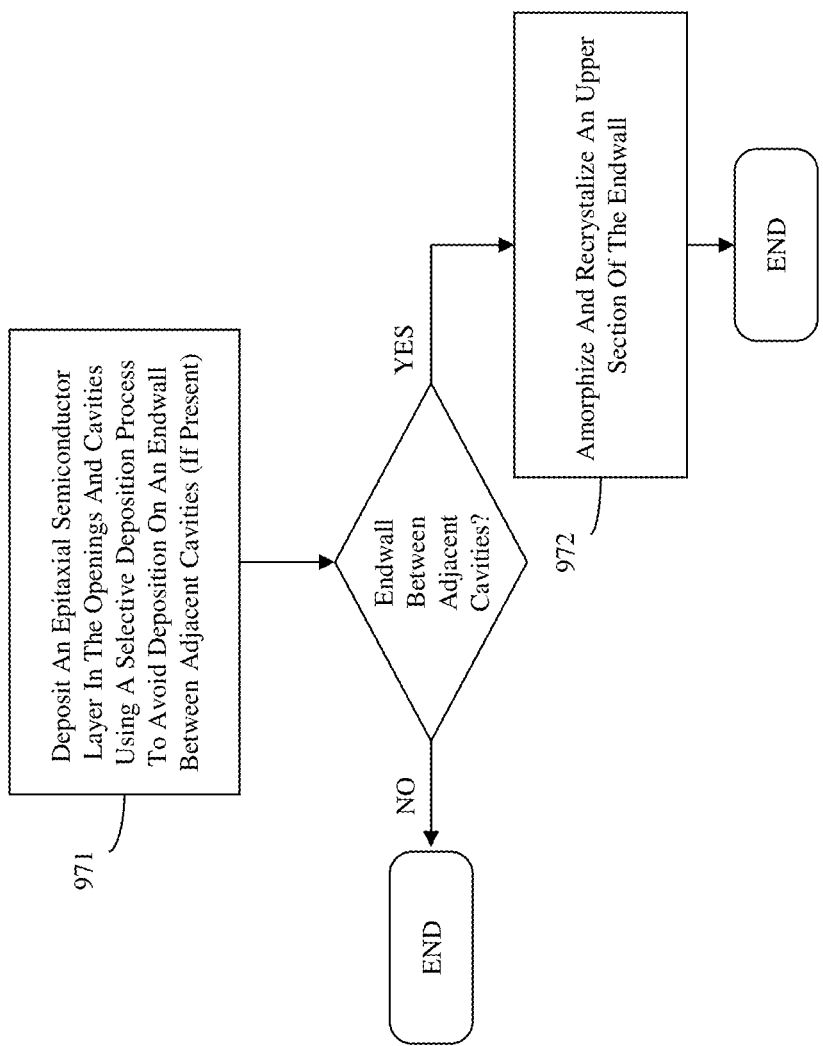

Process flow 3 of FIG. 9E can be employed to form the semiconductor structure embodiments 300A-300B of FIGS. 3A-3B. In this process flow 3, an epitaxial semiconductor layer 325 can be deposited into the openings 322 and cavities 332(*a*)-(*b*) (see process step 971). It should be noted that in this process flow the sizes of the openings and cavities should be such that the epitaxial semiconductor layer 325 plugs the openings 322 before filling the cavities, thereby leaving pocket(s) 331 of trapped air, of trapped gas or under vacuum in the cavities 332(*a*)-(*b*). Following deposition of the epitaxial semiconductor layer, a CMP process can be performed to planarize the semiconductor top surface. If adjacent cavities are merged (e.g., as in the semiconductor structure embodiment 300A of FIG. 3A), the process flow 3 ends. However, if the adjacent cavities 332(*a*)-(*b*) are physically separated by an end wall comprising a remaining portion of the sacrificial semiconductor layer 312, the epitaxial semiconductor deposition process should be selective so the semiconductor material of the epitaxial semiconductor layer is deposited onto exposed surfaces of the upper semiconductor layer 313 and semiconductor substrate 301 (or optional lower semiconductor layer, if present) only and not onto exposed surfaces of the end wall. In this case, additional processing is also required in order to avoid shorting of the upper semiconductor layer 313 to the semiconductor substrate 301 (or, if present, to the optional lower semiconductor layer 311) through the end wall. For example, this additional processing can include amorphizing and recrystallizing a top section of the end wall (see process step 972 and the semiconductor structure embodiment 300B of FIG. 3B). Specifically, at process step 972, an amorphization implant process can be performed whereby inert amorphization ions are implanted into the top section of the end wall so that it is amorphized. The inert amorphization ions can be, for example, Group IV ions (e.g., silicon ions, germanium ions, carbon ions or tin ions), Group 0 nobel gas ions (e.g., argon ions, krypton ions, xenon ions, and neon ions), nitrogen ions, oxygen ions, or any combination thereof. Then, a recrystallization anneal can be performed in order to recrystallize that top section. In this case, the interface between the crystallized bottom section and the amorphized and recrystallized top section provides the necessary electrical isolation. As a result of process flow 3, the plugs 320 that fill the upper portions of the openings 322 are semiconductor plugs and the insulator material contained in the insulator-containing cavities 332(*a*)-332(*b*) is a pocket 331 of trapped air, of trapped gas or under vacuum only.

Process flow 4 of FIG. 9F can be employed to form the semiconductor structure embodiments 400A-400B of FIGS. 4A-4B. In this process flow 4, process steps 981-982 can be essentially the same as process steps 971-972 of process flow 3. Additional processing can include forming additional openings 423 through the epitaxial semiconductor material of layer 425 within the upper portions of the openings 422 (see process step 982). Next, the end wall between adjacent cavities 432(*a*)-(*b*) can be selectively removed (see process step 983) and a conformal dielectric layer 430 (e.g., a conformal silicon dioxide layer or a conformal layer of some other suitable dielectric material) can be deposited into the additional openings 423 and cavities 432(*a*)-(*b*), optionally forming pocket(s) 431 of trapped air, of trapped gas or under vacuum (see process step 984; see the semiconductor structure embodiment 400A of FIG. 4A which is devoid of air-gaps and the semiconductor structure embodiment 400B of FIG. 4B which includes an air-gap 431). Dielectric material can subsequently be removed from the top surface of the upper semiconductor layer 413 using a CMP process and/or a selective etch process (see process step 985). As a result of the process flow 4, each plug 420 in the semiconductor structure embodiments 400A-400B includes an upper section, which is within an upper portion of an opening 422 and which comprises conformal dielectric material of layer 430 laterally surrounded by epitaxial semiconductor material of layer 425; and a lower section, which is below the upper section and which includes conformal dielectric material of layer 430.

Figure 9G:
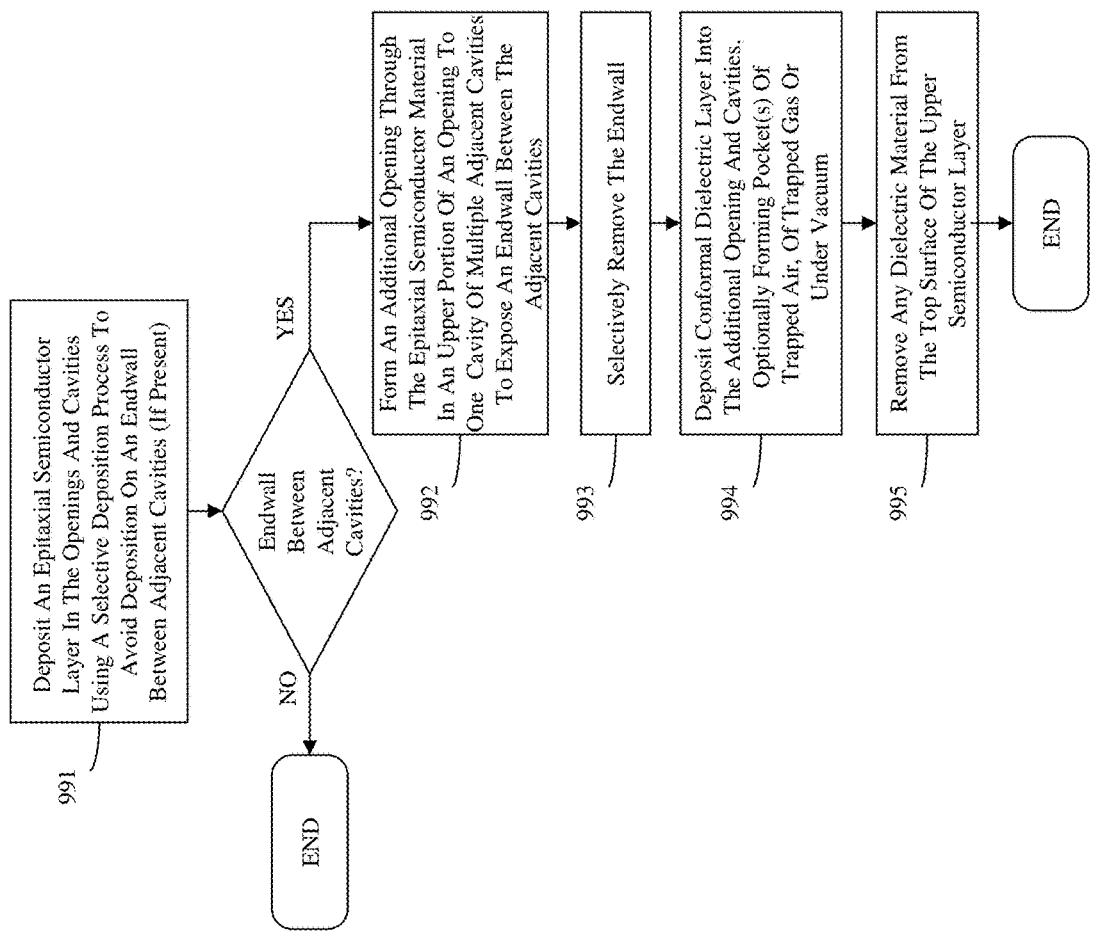

Process flow 5 of FIG. 9G can be employed to form the semiconductor structure embodiments 500A-500B of FIGS. 5A-5B. In this process flow 5, process steps 991-992 can be essentially the same as process steps 971-972 of process flow 3 and process steps 981-982 of process flow 4. Additional processing can include forming an additional opening 523 through the epitaxial semiconductor material of the layer 525 within an upper portion of one opening 522 to one cavity (e.g., cavity 532(*a*)) of multiple adjacent cavities (see process step 992). Next, the end wall between the adjacent cavities 532(*a*)-(*b*) can be selectively removed (see process step 993) and a conformal dielectric layer 530 (e.g., a conformal silicon dioxide layer or a conformal layer of some other suitable dielectric material) can be deposited into the additional opening 523 and cavities 532(*a*)-(*b*), optionally forming pocket(s) 531 of trapped air, of trapped gas or under vacuum (see process step 994; see also the semiconductor structure embodiment 500A of FIG. 5A which is devoid of such pockets 531 and the semiconductor structure embodiment 500B of FIG. 5B which includes a pocket 531 of trapped air, of trapped gas or under vacuum). Dielectric material can subsequently be removed from the top surface of the upper semiconductor layer 513 using a CMP process and/or a selective etch process (see process step 995). As a result of the process flow 5, at least one plug 520(*a*) in the semiconductor structure embodiments 500A-500B includes an upper section, which is within an upper portion of an opening 522 and which comprises conformal dielectric material of layer 530 laterally surrounded by epitaxial semiconductor material of layer 525; and a lower section, which is below the upper section and which includes conformal dielectric material of layer 530. However, at least one other plug 520(*b*) includes epitaxial semiconductor material of the layer 525, which fills the upper portion of an opening 522.

As mentioned above, the methods for forming the semiconductor structure embodiments 100B-100E, 200B-200E, 300A-300B, 400B and 500B all include the formation of one or more pockets 131, 231, 331, 431, 531 of trapped air, of trapped gas or under vacuum in the openings and/or cavities. The dielectric constant of air is approximately one such that it is considered an insulator material. In embodiments where the pockets include trapped gas, the gas can include one or more different types of process gases (e.g., nitrogen, argon, etc.) that similarly have a relatively low dielectric constant of approximately one so as to be considered an insulator material. In embodiments where the pockets are under vacuum, they do not contain an insulator material per se but since the dielectric constant of a perfect vacuum is exactly one such pockets effectively function as an insulator material.

It should be understood that above described process flows for forming the semiconductor structure embodiments 100A-100E, 200A-200E, 300A-300B, 400A-400B and 500A-500B are provided for illustration purposes and are not intended to be limiting. For example, FIGS. 15A and 15B, show that the openings 122, 222, 322, 422, 522 are all formed at process step 942 so as to have the same rectangular shape and the same size. However, optionally, at process step 942, adjacent openings could be formed so as to have different shapes (e.g., circular and square, oval and rectangular, etc.) and/or different sizes. Those skilled in the art will recognize that the amount of fill material (including the size and presence of any pocket of trapped air, of trapped gas or under vacuum) in a given cavity will be a function of the thickness of the material deposited into the cavity during processing as well as the shape and size of the opening. For example, in a smaller opening and/or in an opening with corners (e.g., a square or rectangular opening), deposited material (e.g., see deposited dielectric material at process step 951 of process flow 1, deposited dielectric material at process step 961 of process flow 2, deposited epitaxial semiconductor material at process step 971, deposited epitaxial semiconductor and dielectric material at process steps 981 and 984 of process flow 4, and deposited epitaxial semiconductor and dielectric material at process steps 991 and 994 of process flow 5) may pinch off earlier than it would in a larger opening and/or in an opening without corners (e.g., a round or oval opening). When the shapes and/or sizes of the openings to the cavities are different at process step 942, any of the following could occur: (a) the sizes of the pockets in adjacent cavities could be different; (b) one cavity could have a pocket and another may not; (c) the sizes of different portions of a pocket in merged cavities could be different; (d) one portion of a merged cavity may have a pocket and another may not; etc.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor substrate; and
   a semiconductor-on-insulator region above the semiconductor substrate and comprising:
   a lower semiconductor layer on the semiconductor substrate;
   an upper semiconductor layer above and physically separated from the lower semiconductor layer by at least one cavity,
   wherein upper portions of openings extend through the upper semiconductor layer to the at least one cavity, and
   wherein lower portions of the openings are aligned below the upper portions and extend through the lower semiconductor layer from the at least one cavity to the semiconductor substrate;
   a dielectric layer lining the at least one cavity and further extending into the upper portions of the openings; and
   an additional semiconductor layer within the upper portions of the openings above the dielectric layer.

2. The semiconductor structure of claim 1, wherein the dielectric layer further lines the lower portions of the openings.

3. The semiconductor structure of claim 1, wherein the additional semiconductor layer further covers a top surface of the upper semiconductor layer.

4. The semiconductor structure of claim 1, wherein the dielectric layer within the at least one cavity encapsulates at least one pocket of trapped air, pocket of trapped gas or pocket under vacuum.

5. The semiconductor structure of claim 1, wherein each cavity extends laterally from sides of a corresponding opening such that upper and lower portions of the corresponding opening are essentially centered on the cavity and wherein adjacent cavities that extend laterally from sides of adjacent openings are merged forming a single cavity.

6. The semiconductor structure of claim 1,
   wherein each cavity extends laterally from sides of a corresponding opening such that upper and lower portions of the corresponding opening are essentially centered on the cavity, wherein adjacent cavities that extend laterally from sides of adjacent openings are physically separated by end walls,
wherein the upper semiconductor layer and the end walls comprise different semiconductor materials, and
wherein an interface between a crystalized bottom section and an amorphized and recrystallized top section of each end wall provides electrical isolation.

7. The semiconductor structure of claim 1, further comprising a support structure laterally surrounding the semiconductor-on-insulator region, wherein the support structure comprises at least one of an isolation and a stacked semiconductor region.

* * * * *

UNITED STATES PATENT AND TRADEMARK OFFICE
CERTIFICATE OF CORRECTION

| | | |
|---|---|---|
| PATENT NO. | : 11,515,158 B2 | Page 1 of 1 |
| APPLICATION NO. | : 16/815070 | |
| DATED | : November 29, 2022 | |
| INVENTOR(S) | : Ramsey Hazbun et al. | |

It is certified that error appears in the above-identified patent and that said Letters Patent is hereby corrected as shown below:

In the Specification

Column 2, Line 45 reads as follows: "In some embodiments, adjacent cavities, which extend laterally from the sides of adjacent openings, can be merged into a single relatively large cavity during." It should read as follows: "In some embodiments, adjacent cavities, which extend laterally from the sides of adjacent openings, can be merged into a single relatively large cavity."

Signed and Sealed this
Third Day of January, 2023

Katherine Kelly Vidal
*Director of the United States Patent and Trademark Office*